United States Patent
Kwag et al.

(10) Patent No.: US 11,450,652 B2
(45) Date of Patent: Sep. 20, 2022

(54) DISPLAY MODULE MANUFACTURED BY MICRO LED TRANSFERRING METHOD

(71) Applicant: SAMSUNG ELECTRONICS CO., LTD., Suwon-si (KR)

(72) Inventors: Doyoung Kwag, Suwon-si (KR); Byungchul Kim, Suwon-si (KR); Sangmoo Park, Suwon-si (KR); Minsub Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 8 days.

(21) Appl. No.: 16/882,914

(22) Filed: May 26, 2020

(65) Prior Publication Data
US 2020/0395348 A1    Dec. 17, 2020

(30) Foreign Application Priority Data
Jun. 13, 2019  (KR) ........................ 10-2019-0069763

(51) Int. Cl.
*H01L 25/16*   (2006.01)
*H01L 33/50*   (2010.01)
*H01L 25/075*  (2006.01)

(52) U.S. Cl.
CPC ........ *H01L 25/167* (2013.01); *H01L 25/0753* (2013.01); *H01L 33/50* (2013.01); *H01L 2933/0041* (2013.01)

(58) Field of Classification Search
CPC .... H01L 25/167; H01L 25/0753; H01L 33/50
See application file for complete search history.

(56) References Cited

U.S. PATENT DOCUMENTS

| | | |
|---|---|---|
| 8,450,147 B2 | 5/2013 | Chandra |
| 8,476,826 B2 | 7/2013 | Oohata et al. |
| 8,646,505 B2 | 2/2014 | Bibl et al. |
| 10,096,740 B1 | 10/2018 | Chen |
| 10,157,897 B1 | 12/2018 | Smith et al. |

(Continued)

FOREIGN PATENT DOCUMENTS

| | | |
|---|---|---|
| CN | 107170876 A | 9/2017 |
| CN | 109802018 A | 5/2019 |

(Continued)

OTHER PUBLICATIONS

International Search Report (PCT/ISA/210) dated Sep. 17, 2020 by the International Searching Authority in counterpart International Patent Application No. PCT/KR2020/006739.

(Continued)

*Primary Examiner* — Jay C Chang
*Assistant Examiner* — Mikka Liu
(74) *Attorney, Agent, or Firm* — Sughrue Mion, PLLC

(57) ABSTRACT

A micro LED transferring method is provided. The transferring method includes selectively applying a color conversion material to a mono-color substrate, the mono-color substrate including first micro LEDs in a first color; obtaining a multi-color substrate based on a result of the applying, the multi-color substrate including the first micro LEDs in the first color and second micro LEDs in a second color different from the first color; and irradiating a laser beam toward the multi-color substrate to transfer the first micro LEDs and the second micro LEDs to a target substrate.

9 Claims, 26 Drawing Sheets

(56) References Cited

U.S. PATENT DOCUMENTS

| | | | |
|---|---|---|---|
| 10,224,467 | B2 | 3/2019 | Cui et al. |
| 10,566,381 | B2 | 2/2020 | Kwak et al. |
| 2017/0162552 | A1 | 6/2017 | Thompson |
| 2017/0287882 | A1* | 10/2017 | Cok ................ H01L 25/0753 |
| 2017/0309798 | A1 | 10/2017 | Bonar et al. |
| 2018/0047710 | A1 | 2/2018 | Ulmer |
| 2018/0074240 | A1 | 3/2018 | Bonar et al. |
| 2018/0166429 | A1 | 6/2018 | Chong et al. |
| 2019/0005870 | A1* | 1/2019 | Son ..................... H01L 33/62 |
| 2019/0035988 | A1 | 1/2019 | Liu |
| 2019/0043844 | A1* | 2/2019 | Liu ................ H01L 25/0753 |
| 2019/0221466 | A1 | 7/2019 | Arai |
| 2020/0313046 | A1 | 10/2020 | Tian et al. |

FOREIGN PATENT DOCUMENTS

| | | |
|---|---|---|
| JP | 2010-251360 A | 11/2010 |
| JP | 2018-60993 A | 4/2018 |
| KR | 10-1876008 B1 | 7/2018 |
| KR | 10-1890582 B1 | 8/2018 |
| WO | 2014/030830 A1 | 2/2014 |

OTHER PUBLICATIONS

Written Opinion (PCT/ISA/237) dated Sep. 17, 2020 by the International Searching Authority in counterpart International Patent Application No. PCT/KR2020/006739.
Communication dated Apr. 26, 2022, issued by the European Patent Office in counterpart European Application No. 20823408.8.

* cited by examiner

DISPLAY MODULE MANUFACTURED BY MICRO LED TRANSFERRING METHOD

CROSS-REFERENCE TO RELATED APPLICATION(S)

This application is based on and claims priority under 35 U.S.C. § 119(a) to a Korean Patent Application No. 10-2019-0069763, filed on Jun. 13, 2019, in the Korean Intellectual Property Office, the disclosure of which is incorporated by reference herein in its entirety.

BACKGROUND

1. Field

Example embodiments of the disclosure relate to a method of transferring a plurality of micro light emitting diodes (LEDs) to a target substrate from a transfer substrate including the plurality of micro LEDs, and a display module manufactured by the method.

2. Description of Related Art

A micro light emitting diode (LED) is an ultra mini inorganic light emitting substance, which emits light by itself without a color filter and a backlight. Specifically, a micro LED may refer to an ultra mini LED which has a 1/10 length and a 1/100 area of those of a general light emitting diode (LED) chip, and of which width, length, and height are in sizes of between 10 and 100 micrometers (μm).

Micro LEDs are manufactured by growing the micro LEDs in the form of chips on a wafer (or a growth substrate) through an epitaxy process, etc. Micro LEDs manufactured in this manner may be transferred to a target substrate and constitute a display module.

A micro-luminescent diode (e.g., micro LED, mLED, or μLED) display panel is a flat display panel that includes a plurality of inorganic LEDs that are each smaller than 100 micrometers.

A micro LED display panel provides improved contrast, faster response time, and higher energy efficiency as compared to those of a liquid crystal panel that requires a back light.

Although both organic LEDs (OLEDs) and micro LEDs have high energy efficiency, micro LEDs are brighter, have improved luminous efficiency, and have a longer lifespan than as compared to OLEDs.

SUMMARY

One or more example embodiments provide a method of transferring a plurality of micro light emitting diodes (LEDs) to a target substrate, and a display module manufactured by the method, in which a plurality of micro LEDs in different colors in a multi-color substrate are transferred to the target substrate in one operation of a transfer process. Thus, efficiency and speed in manufacturing a display module may be increased.

According to an aspect of an example embodiment, there is provided a method of transferring a micro light emitting diode (LED) to a target substrate, the method including: selectively applying a color conversion material to a mono-color substrate, the mono-color substrate including first micro LEDs in a first color; obtaining a multi-color substrate based on a result of the applying, the multi-color substrate including the first micro LEDs in the first color and second micro LEDs in a second color different from the first color; and irradiating a laser beam toward the multi-color substrate to transfer the first micro LEDs and the second micro LEDs to a target substrate.

The multi-color substrate may further include third micro LEDs in at least one third color that is different from the first color and the second color.

The color conversion material may include at least one of a phosphor or a quantum dot.

Transferring of the first micro LEDs and the second micro LEDs may be based on a color pattern of the first micro LEDs in the first color and the second micro LEDs in the second color on the multi-color substrate.

In each transfer operation, the first micro LEDs and the second micro LEDs are transferred to the target substrate according to the same transfer pattern.

A color pattern in transferring the first micro LEDs and the second micro LEDs may be based on a color pattern of the multi-color substrate without rotation or a color pattern of the multi-color substrate that is rotated 180 degree.

The irradiating may include irradiating the laser beam, generated by a laser beam generator located above the multi-color substrate, toward a plurality of predetermined areas of the multi-color substrate.

According to an aspect of an example embodiment, there is provided a display module including: a substrate; a layer including thin film transistor (TFT) and provided on the substrate; and a plurality of pixels arranged at specific pitches on the layer, wherein each pixel includes first micro light emitting diodes (LEDs) in a first color and second micro LEDs in a second color different from the first color, at least one of the first micro LEDs and at least one of the second micro LEDs having been transferred together to the TFT layer in one transfer operation.

The first micro LEDs and the second micro LEDs may be transferred from a transfer substrate to the layer, and the transfer substrate may be provided as a multi-color substrate in which a plurality of micro LEDs in two or more colors are provided.

The plurality of micro LEDs in the two or more colors may be based on an application of a color conversion material to at least one of the first micro LEDs in the first color in a mono-color substrate, the color conversion material including at least one of a phosphor or a quantum dot.

In each transfer operation, at least one of the first micro LEDs and at least one of the second micro LEDs may be transferred to the layer according to the same transfer pattern.

A transfer pattern in transferring the at least one of the first micro LEDs and at least one of the second micro LEDs may be based on a color pattern of the plurality of micro LEDs in the two or more colors on the multi-color substrate.

The transfer pattern may include at least one of an L-shaped pattern, a triangle-shaped pattern, or a square-shaped pattern.

A transfer pattern in transferring the at least one of the first micro LEDs and at least one of the second micro LEDs may be based on a square-shaped pattern of different colors by the plurality of micro LEDs on the multi-color substrate.

A size of each of the first micro LEDs may be different from a size of each of the second micro LEDs.

Each pixel further may include third micro LEDs in a third color different from the first color and the second color, and a size of each of the third micro LEDs is equal to the size of each of the first micro LEDs or the size of each of the second micro LEDs.

The plurality of micro LEDs may have different thicknesses based on an amount of a color conversion material applied thereto.

A micro LED located toward an outer rim portion of the multi-color substrate, among the plurality of micro LEDs, may have a greater thickness than a micro LED located at a center portion of the multi-color substrate.

A micro LED located toward an outer rim portion of the multi-color substrate, among the plurality of micro LEDs, may have a smaller thickness than a micro LED located at a center portion of the multi-color substrate.

According to an aspect of an example embodiment, there is provided a non-transitory computer-readable recording medium including a program for executing a method of transferring a micro light emitting diode (LED), the method including: selectively applying a color conversion material to a mono-color substrate, the mono-color substrate including first micro LEDs in a first color; obtaining a multi-color substrate based on a result of the applying, the multi-color substrate including the first micro LEDs in the first color and second micro LEDs in a second color different from the first color; and irradiating a laser beam toward the multi-color substrate to transfer the first micro LEDs and the second micro LEDs to a target substrate.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
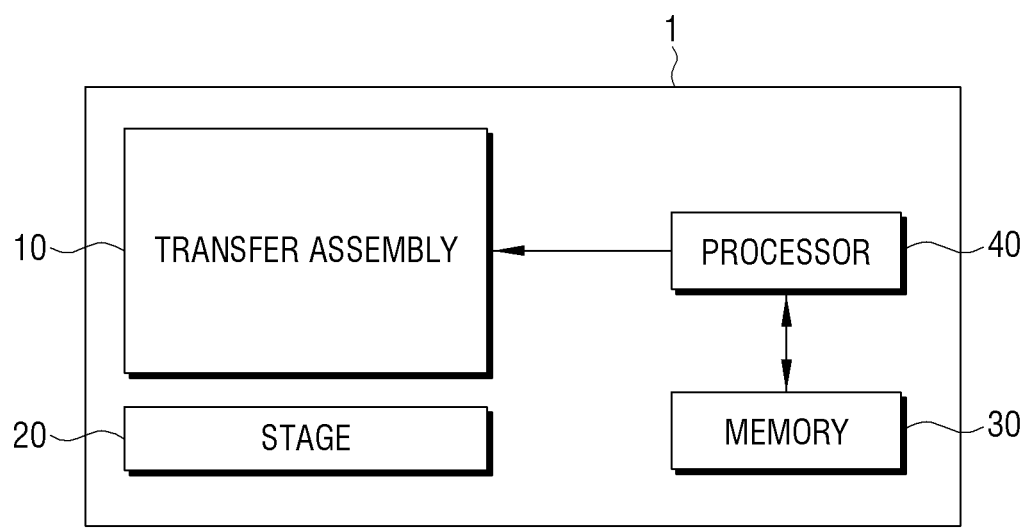
FIG. 1 is a schematic block diagram illustrating a micro light emitting diode (LED) transferring device according to an example embodiment.

Hereinafter, example embodiments of the disclosure will be described with reference to the accompanying drawings. However, the disclosure is not limited to the example embodiments disclosed herein, but may be implemented in various forms and various modifications may be made to the disclosure. The descriptions of the example embodiments of the disclosure are only provided to make the descriptions of the disclosure complete, and to make those skilled in art to which the disclosure belongs fully understand the range of the disclosure. In the accompanying drawings, components were illustrated in more enlarged sizes than their actual sizes for the convenience of description, and the proportion of each component may be exaggerated or reduced.

When it is described that a component is "on top of" or "contacts" another component, it should be understood that a component may directly contact or be connected with the top portion of another component, but still another component may exist between the components. In contrast, when it is described that a component is "just on top of" or "directly contacts" another component, it may be understood that still another component does not exist between the components. Other expressions describing relations between components, for instance, expressions such as "between~" and "directly between~" may be interpreted in the same manner.

Terms such as "first," "second" and the like may be used to describe various elements, but they are not intended to limit the elements. Such terms are used only to distinguish one element from another element. For example, a first element may be called a second element, and a second element may be called a first element in a similar manner, without departing from the scope of the disclosure.

Also, singular expressions include plural expressions, unless defined obviously differently in the context. In addition, terms such as "include" and "have/has" should be construed as designating that there are such characteristics, numbers, steps, operations, elements, components or a combination thereof described in the specification, and the terms may be interpreted to denote that one or more of other characteristics, numbers, steps, operations, elements, components or a combination thereof may be added.

The terms used in the example embodiments of the disclosure may be interpreted as meaning generally known to people having ordinary knowledge in the pertinent technical field, as long as they are not defined differently.

The display module manufactured according to the example embodiments of the disclosure may include a substrate wherein a thin film transistor (TFT) layer is formed on one surface, a plurality of micro light emitting diodes (LEDs) arranged while being electronically connected to the TFT layer, and a wiring electronically connecting circuits arranged on the rear surface of the substrate. Here, the substrate may correspond to the target substrate that will be described later. Also, the substrate may be any one of a glass substrate, a flexible substrate, or a plastic substrate, and may be referred to as a backplane.

Also, the display module according to the example embodiments of the disclosure may include a rear side substrate electronically connected to the rear surface of a substrate through a flexible printed circuit (FPC). Here, the rear side substrate may have a form of thin film or a form of thin glass having the thickness of tens of μm (e.g., smaller than or equal to 50 μm). When the rear side substrate includes a form of thin film, it may be formed of a plastic material, for example, any one material among polyimide (PI), polyethylene terephthalate (PET), polyethersulfone (PES), polyethylene naphthalate (PEN), and polycarbonate (PC).

On a substrate according to the example embodiments of the disclosure, a side surface wiring formed in an edge part may be formed, and the side surface wiring may electronically connect a first contact pad formed in the edge part of the front surface of the substrate and a second contact pad formed on the rear surface of the substrate. For this, the side surface wiring may be formed along the front surface, the side sectional surface, and the rear surface of the substrate, and one end thereof may be electronically connected to the first contact pad and the other end may be electronically connected to the second contact pad. Here, a portion of the side surface wiring is formed on the side sectional surface of the substrate, and thus the side sectional surface may protrude more than the side sectional surface of the TFT substrate as much as the thickness of the side surface wiring. In this case, to the second contact pad, the rear side surface may be electronically connected through the FPC. Also, a driver integrated circuit (IC) mounted on the rear surface of the TFT substrate may be directly connected to the second contact pad or may be indirectly connected through a separate wiring.

In addition, a display module according to an example embodiment may be applied to a wearable device, a portable device, a handheld device, and an electronic product or an electronic device having various displays in a single unit, and may be applied to small display devices such as monitors for personal computers and televisions (TVs), and large display devices such as digital signage and electronic displays through a plurality of assembly arrangements.

A plurality of display modules constituted as above may be arranged in a tiled type, and a large-size display device may thereby be manufactured.

The width, length, and height of a micro LED according to the disclosure are respectively in a size of from 10 μm to 100 μm, and it may be a semiconductor chip which includes an inorganic light emitting substance, and which may emit light by itself if power is supplied.

Also, a micro LED has a fast reaction speed, low power consumption, and high luminance, and is thus gaining spotlight as a light emitting diode for next-generation displays. Specifically, a micro LED has higher efficiency in converting electrons to photons compared to a related art liquid crystal display (LCD) or organic light emitting diode (OLED). That is, a micro LED has higher "brightness per watt" compared to a related art LCD or OLED display. Accordingly, a micro LED may exert the same brightness even with approximately half the energy compared to a related art LED (the width, length, and height respectively exceed 100 μm) or OLED.

In addition, a micro LED may implement a high resolution, and superior colors, contrast, and brightness, and may thus express colors in a wide range precisely, and implement a clear screen even in the outdoors where sunlight is bright. Also, a micro LED is strong against a burn-in phenomenon and emits a small amount of heat, and thus a long lifespan is guaranteed without deformation.

In the disclosure, a wafer (e.g., a sapphire substrate) which becomes a base is used as a growth substrate and after an epitaxial growth, an n/p electrode is formed and a plurality of micro LEDs may be formed through an isolation process. The plurality of micro LEDs are transported from the growth substrate to a transfer substrate. In this case, the transfer substrate is a substrate in a state of being able to transfer the plurality of micro LEDs to a target substrate, and it may be referred to as a transferring substrate or a donor wafer.

In the disclosure, a transfer substrate may also be referred to as a multi-color substrate including a plurality of micro LEDs emitting different colors. Also, a multi-color substrate in the disclosure means a transfer substrate formed by using a color conversion process of applying a color conversion material selectively on a mono-color substrate. In addition, in the disclosure, a mono-color substrate may refer to a substrate including a plurality of micro LEDs emitting light of a single color on which color conversion materials are not applied.

Also, in the disclosure, a mono-color substrate may be formed into a multi-color substrate including micro LEDs in two or more colors by using a color conversion process. Specifically, a transfer substrate may be a multi-color substrate including micro LEDs in two or more colors such as red/blue, red/green, green/blue, red/blue/green, red/blue/white, red/green/blue/white, or red/green/green/white, etc. A multi-color substrate including micro LEDs in various colors as above may have various patterns for transferring together a plurality of predetermined micro LEDs in different colors to a target substrate. Here, the meaning of 'transferring together to a target substrate' may mean sequentially transferring a plurality of micro LEDs in different colors at specific time intervals. Alternatively, it may mean that transfer is performed within one time operation of a transferring process. Here, 'various patterns' mean color patterns expressed on a multi-color substrate, and color patterns of a multi-color substrate may be formed in various ways according to transfer patterns in which the micro LEDs are to be transferred to a target substrate.

A transfer substrate in the disclosure may be formed as a transparent material (e.g., quartz) through which a laser bean may pass. Also, a transfer substrate in the disclosure may be manufactured in various forms such as a wafer shape, a square shape, etc.

In the disclosure, a target substrate may be used as including the same meaning as a display substrate provided in a display module.

A pattern of a plurality of multi-color micro LEDs does not necessarily have to be the same pattern as the aforementioned pattern of the multi-color substrate 57. For example, patterns formed on a multi-color substrate may be formed in various ways depending on embodiments. For example, the pattern of a multi-color substrate may include a pattern in which red, green, and blue micro LEDs are arranged alternatingly along a Y-axis direction in a group of two rows or three rows. However, this is merely an example and the disclosure is not limited thereto.

According to example embodiments of the disclosure, there are provided a micro LED transferring method in which a color conversion material is applied to some of micro LEDs on a mono-color substrate, a multi-color substrate including a plurality of micro LEDs in different colors, and micro LEDs in different colors on the multi-color substrate are transferred together to a target substrate, and a display module manufactured by the method.

Hereinafter, the configuration of a micro LED transferring device according to an example embodiment will be described with reference to FIG. 1.

FIG. 1 is a schematic block diagram illustrating a micro LED transferring device according to an example embodiment.

Referring to FIG. 1, a micro LED transferring device 1 may include a transfer assembly 10 configured to transfer a plurality of micro LEDs arranged on a transfer substrate 57 (refer to FIG. 5) to a target substrate 70 (refer to FIG. 5), a stage 20 that is arranged to be adjacent to the transfer assembly 10 and is configured to move the target substrate 70 in directions of X, Y, and/or Z axes, a memory 30 configured to store characteristic information of each of the plurality of micro LEDs, and a processor 40 configured to determine locations to which the plurality of micro LEDs are respectively to be arranged on the transfer substrate 57 based on the stored characteristic information, and control the transfer assembly 10 and the stage 20 to transfer the plurality of micro LEDs to the determined locations of the plurality of micro LEDs, respectively.

The transfer assembly 10 may transfer together predetermined micro LEDs to the target substrate 70 from the transfer substrate 57 wherein the plurality of micro LEDs are arranged on the target substrate 70 through a laser lift off (LLO) method. However, the LLO method is only an example and the disclosure is not limited thereto.

Also, the transfer assembly 10 may include a laser generator (not shown) configured to irradiate a laser beam toward the transfer substrate 57, and a stage (not shown) which may move the transfer substrate 57 in a direction of the X axis, the Y axis, and/or the Z axis, and may rotate the transfer substrate 57 with respect to the Z axis, to proceed with a transferring process by a laser lift off (LLO) method.

The stage 20 may separably clamp the target substrate 70 on a top surface of the stage 20, and may move the target substrate 70 along the X axis, the Y axis, and the Z axis in a clamped state and rotate the target substrate 70 with respect to the Z axis.

The memory 30 may be implemented as at least one of a flash memory type, a read only memory (ROM), a random access memory (RAM), a hard disk type, a multimedia card micro type, or a card type memory (e.g., a secure digital (SD) or an extreme digital (XD) memory, etc.).

Also, the memory 30 is electronically connected with the processor 40 and may exchange signals and/or information with the processor 40. The memory 30 may store characteristic information of a plurality of micro LEDs that is input or searched, and the processor 40 may access the characteristic information stored in the memory 30.

The processor 40 controls the overall operations of the micro LED transferring device 1. That is, the processor 40 is electronically connected with the transfer assembly 10 and the stage 20 and may control the transfer assembly 10 and the stage 20.

For example, the processor 40 may control the transfer assembly 10 and the stage 20, to transport a plurality of micro LEDs from a growth substrate (not shown) to a temporary substrate (not shown), and may then transfer the plurality of micro LEDs from the temporary substrate to a transfer substrate. Here, the transfer substrate may be a mono-color substrate 50 (refer to FIG. 2).

In this case, all of the plurality of micro LEDs grown on the growth substrate may be in the same color, for example, blue micro LEDs grown with an InGaN base on a sapphire wafer.

Because the plurality of micro LEDs grown on the growth substrate may not have uniform luminance and wavelengths for each area on the growth substrate, when the plurality of micro LEDs are transported from the growth substrate to the temporary substrate, the plurality of micro LEDs may be arranged on the temporary substrate to have generally uniform characteristics for the entire areas of the temporary substrate by using the characteristic information of the plurality of micro LEDs.

In an example embodiment, the processor 40 may identify and analyze characteristics of the plurality of micro LEDs grown on the growth substrate, such as the luminance and the wavelengths, etc. of the plurality of micro LEDs for each area of the growth substrate. A result of analysis may be stored in the memory 30.

When the characteristics of the plurality of micro LEDs are identified and analyzed, based on the result of analysis, the processor 40 may simulate a combination of the locations of the plurality of micro LEDs on the temporary substrate, the combination being such that the luminance and the wavelengths of the display module are expressed as being overall uniform when the plurality of micro LEDs are arranged in a single color (e.g., a blue color) on the temporary substrate from the growth substrate based on the combination of the locations.

When an optimal arrangement of the plurality of micro LEDs to be arranged on the temporary substrate is determined based on the simulation, the processor 40 may generate a data map based on the optimal arrangement. The data map may be stored in the memory 30.

Based on the data map, the plurality of micro LEDs on the growth substrate may be transported to the temporary substrate through, for example, a pick-and-place method, a stamping method, or an LLO method. The plurality of micro LEDs transported to the temporary substrate may be transported to the transfer substrate 57.

In the above, an example in which the plurality of micro LEDs are transported from the growth substrate to the temporary substrate based on the data map is described, but the disclosure is not limited thereto. For example, when the plurality of micro LEDs are transported from the growth substrate to the temporary substrate, the plurality of micro LEDs may be transported from the growth substrate to corresponding locations of the temporary substrate without considering the characteristics of each micro LED, and when the plurality of micro LEDs are transported from the temporary substrate to the transfer substrate, the plurality of micro LEDs may be transported based on the aforementioned data map that is generated based on analysis of the characteristics of each micro LED.

The processor 40 may control the transfer assembly 10 and the stage 20, and transport the plurality of micro LEDs arranged on the transfer substrate 57 to the target substrate 70. Here, the transfer substrate may be a multi-color substrate 57 (refer to FIG. 2) including multi-color micro LEDs manufactured by using a color conversion process that will be described below.

The disclosure is not limited to controlling all of components of the micro LED by a single processor 40, and each component of the micro LED transferring device 1 may be controlled by using a plurality of independent processors. Here, the processor 40 may include one or more of a central processing unit (CPU), a controller, an application processor (AP) or a communication processor (CP), and an advanced reduced instruction set computer (RISC) machines (ARM) processor.

Hereinafter, a process of manufacturing a mono-color substrate into a multi-color substrate by using a color conversion process according to an example embodiment will be described with reference to FIG. 2.

On the mono-color substrate 50, mono-color micro LEDs are formed, and the substrate 50 may be manufactured into a multi-color substrate 57 including multi-color micro LEDs by using a color conversion process. Such a color conversion process may be included as a part of the transferring process according to the disclosure.

Figure 2:
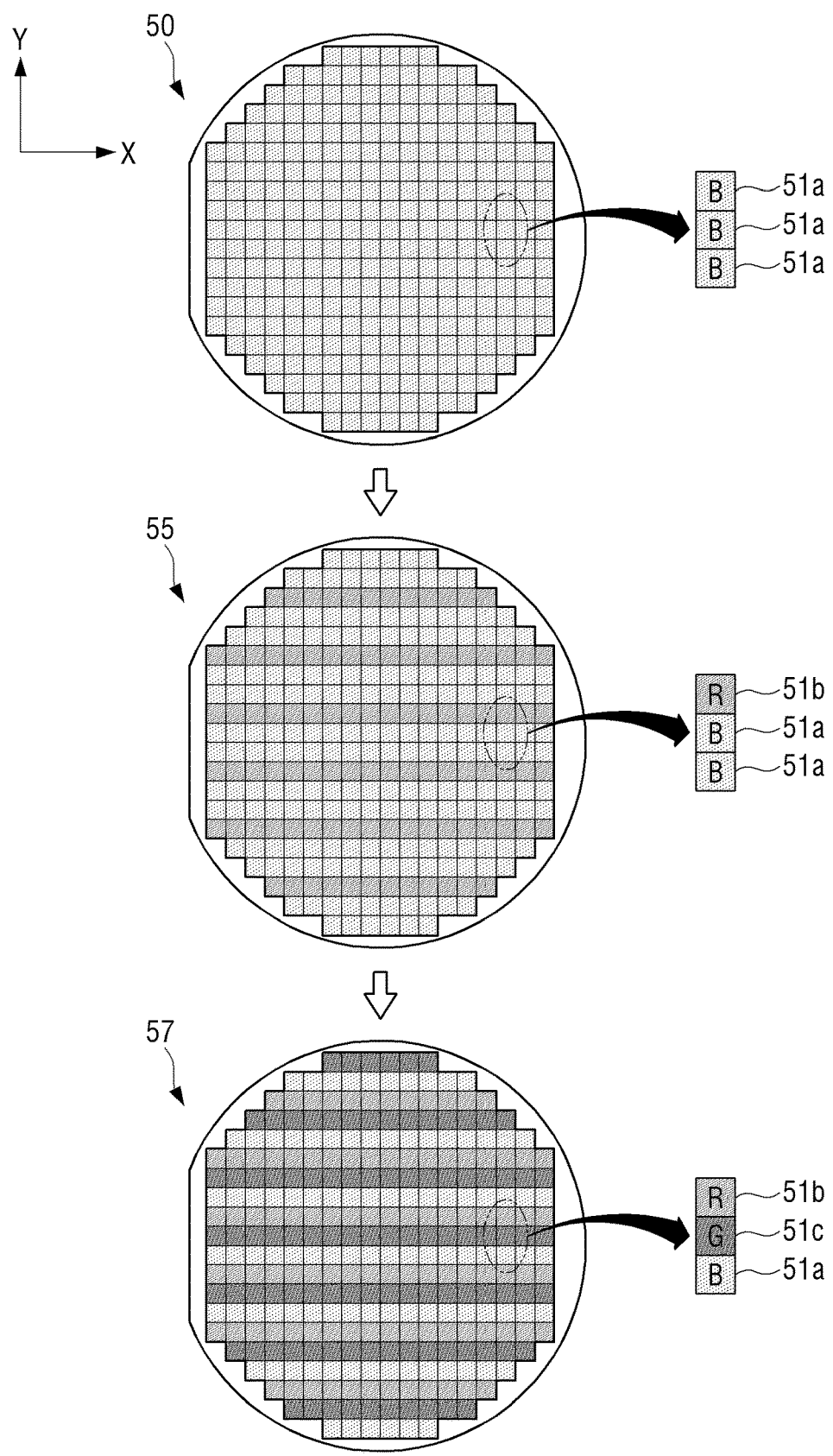
FIG. 2 is a schematic diagram illustrating a process of forming a mono-color transfer substrate into a multi-color substrate by using a color conversion process according to an example embodiment.

Referring to FIG. 2, to obtain a desired color emitted from micro LEDs on the mono-color substrate 50, e.g., a red color, color conversion materials may be applied on some of the micro LEDs on the mono-color substrate 50.

Accordingly, the mono-color substrate 50 may be manufactured into a multi-color substrate 55 including blue micro LEDs 51a and red micro LEDs 51b.

Here, the color conversion materials may include at least one of a phosphor and a quantum dot, and such color conversion materials may be applied on surfaces of the blue micro LEDs 51a by a spin coating process or a pulse-spray coating process.

To obtain another desired color emitted from micro LEDs on the multi-color substrate 55, e.g., a green color, color conversion materials may be applied on some of the blue micro LEDs 51a on the multi-color substrate 55. Accordingly, the multi-color substrate 55 may be manufactured into the multi-color substrate 57 having the blue micro LEDs 51a, the red micro LEDs 51b, and green micro LEDs 51c.

Based on the color conversion process, the multi-color substrate 57 may include a pattern in which the red micro LEDs 51b, the green micro LEDs 51c, and the blue micro LEDs 51a are sequentially arranged along the Y axis in a row.

Hereinafter, a process of transferring the plurality of micro LEDs including the blue micro LEDs 51a, the red micro LEDs 51b, and the green micro LEDs 51c to the target substrate 70 by using the multi-color substrate 57 manufactured as above will be described.

Figure 3:
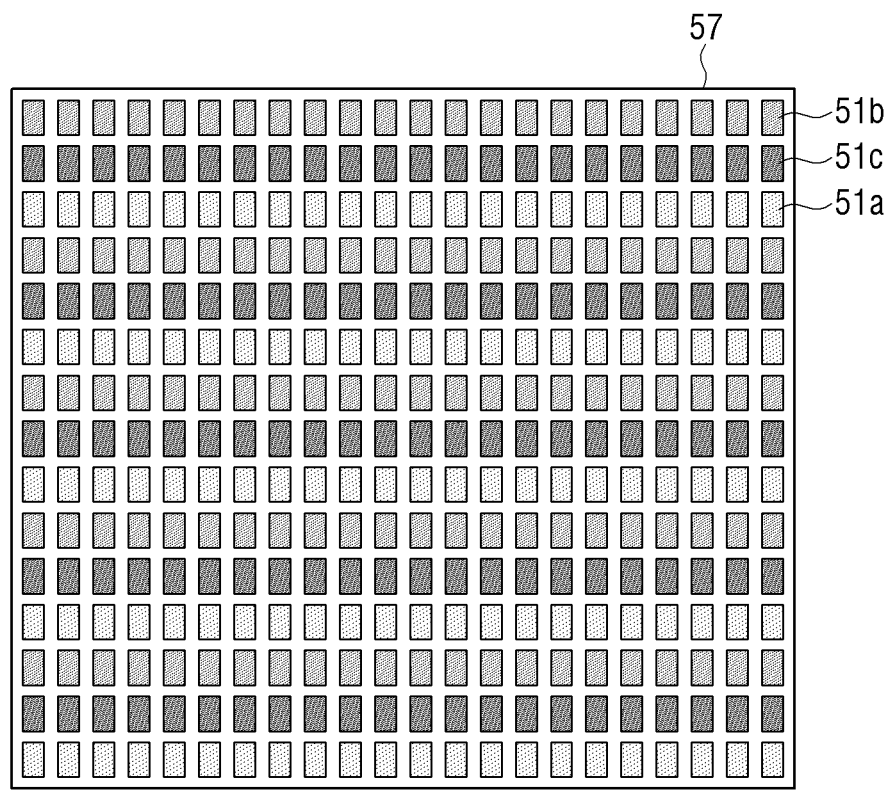
FIG. 3 is an enlarged view illustrating a portion of the multi-color substrate illustrated in FIG. 2.
Figure 4:
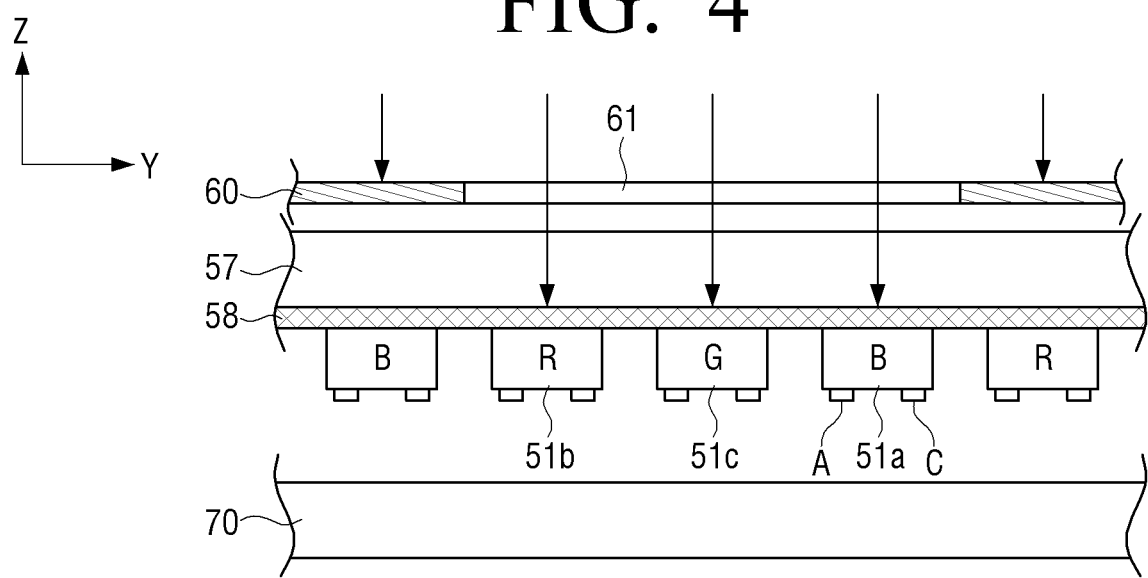
FIG. 4 is a schematic diagram illustrating an example of irradiating a laser beam on an area of a transfer substrate determined in advance by a mask according to an example embodiment.
Figure 5:
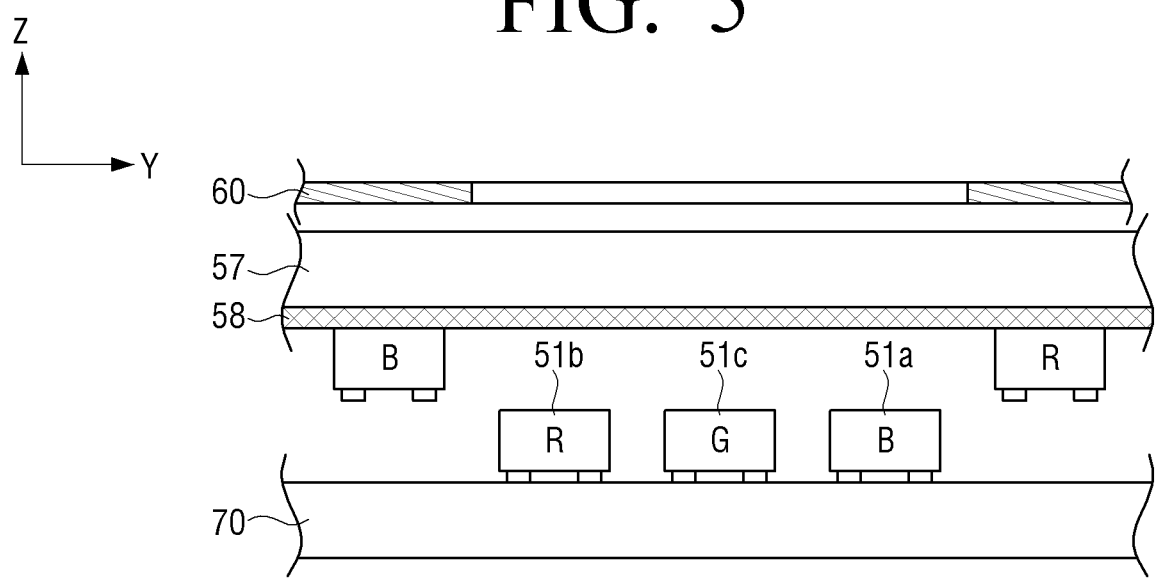
FIG. 5 is a schematic diagram illustrating an example in which a plurality of multi-color micro LEDs selected in advance are transferred from a transfer substrate to a target substrate according to an example embodiment.
Figure 6:
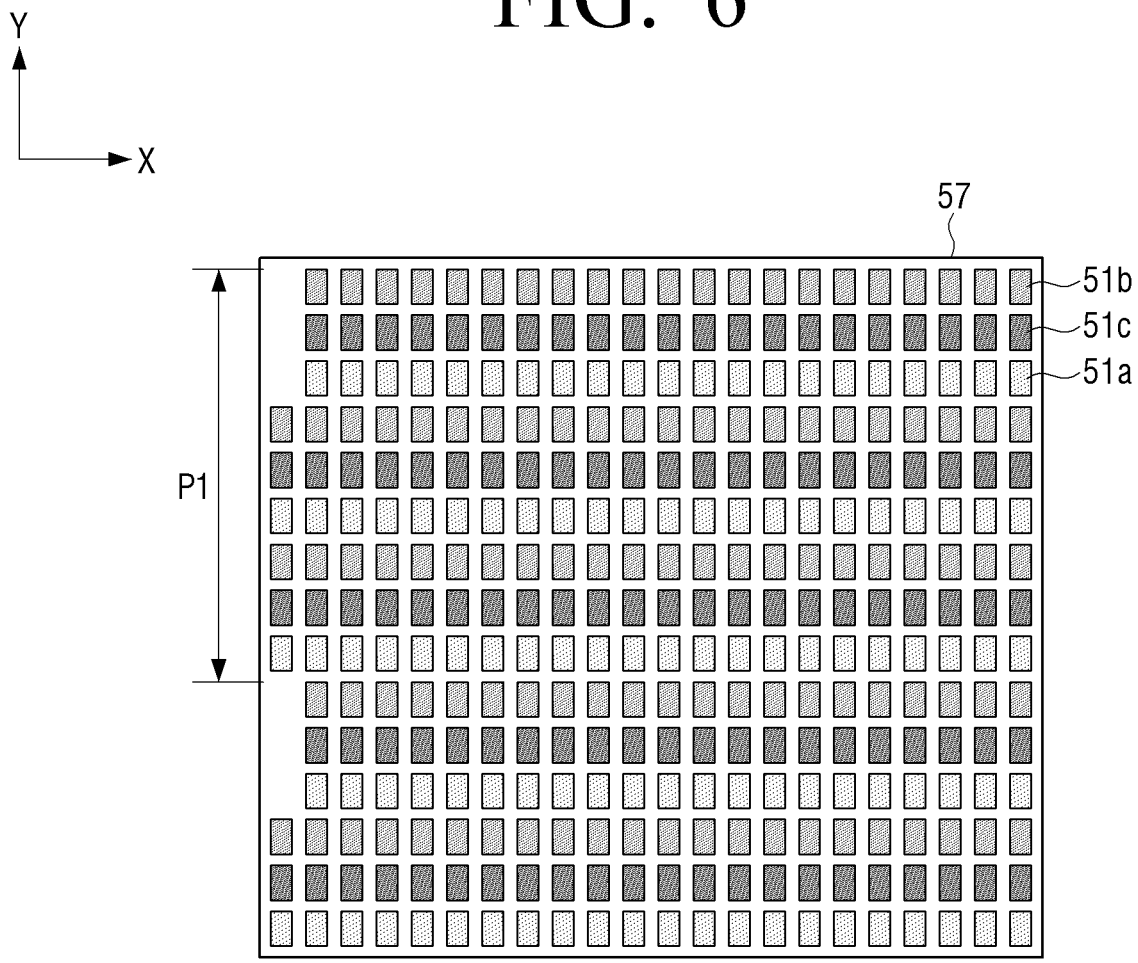
FIG. 6 is a diagram illustrating a state in which some of a plurality of predetermined micro LEDs are transferred from a multi-color substrate to a transfer substrate according to an example embodiment.
Figure 7:
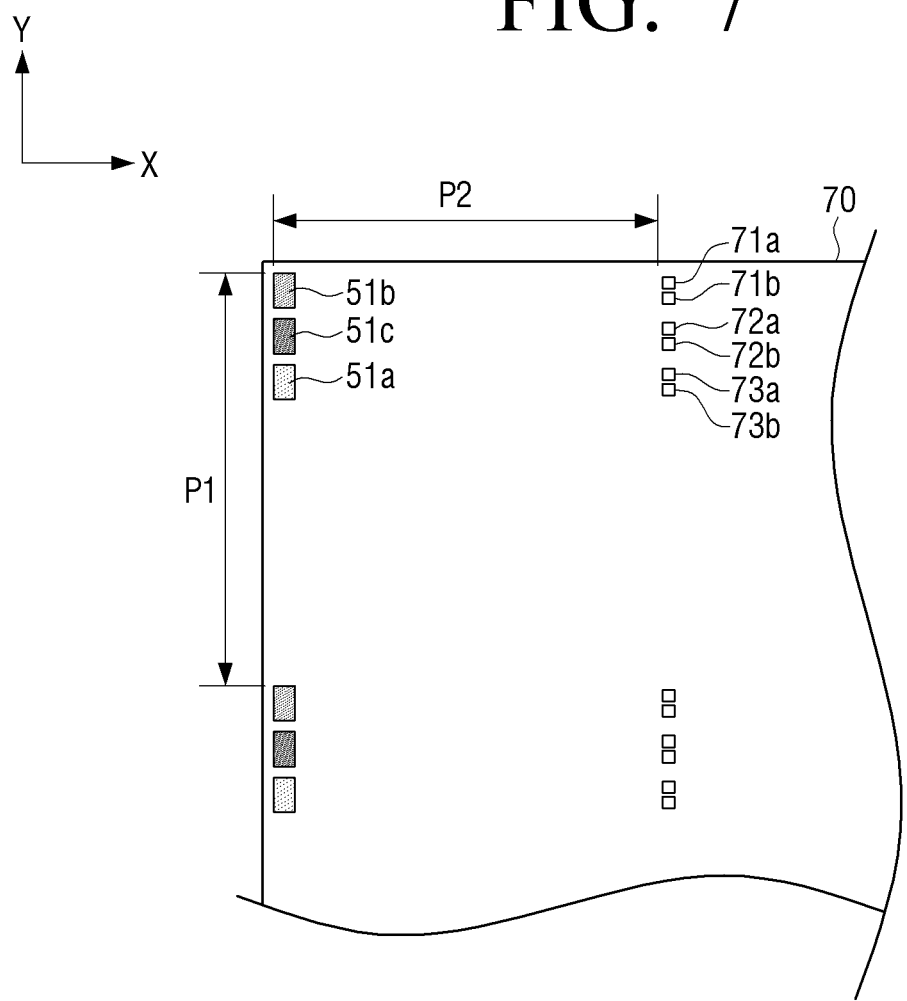
FIG. 7 is a diagram illustrating a state in which some of a plurality of micro LEDs have been transferred to predetermined locations on a target substrate according to an example embodiment.

FIG. 3 is an enlarged view illustrating a portion of the multi-color substrate illustrated in FIG. 2, and FIG. 4 is a schematic diagram illustrating an example in which, in irradiating a laser beam on a transfer substrate, the laser beam is irradiated on an area determined in advance by a mask. FIG. 5 is a schematic diagram illustrating an example in which a plurality of multi-color micro LEDs selected in advance are transferred together from a transfer substrate to a target substrate through the transferring process in FIG. 4, FIG. 6 is a diagram illustrating a state in which a plurality of predetermined micro LEDs are transferred to the transfer substrate illustrated in FIG. 5, and FIG. 7 is a diagram illustrating a state in which a plurality of micro LEDs have been transferred to predetermined locations on the target substrate illustrated in FIG. 5.

Referring to FIG. 3, the multi-color substrate 57 may include a pattern in which the red micro LEDs 51b, the green micro LEDs 51c, and the blue micro LEDs 51a are alternatingly formed along the Y axis direction in a row.

Referring to FIG. 4, the multi-color substrate 57 is fixed to the stage 20, and the plurality of multi-color micro LEDs 51a, 51b, 51c arranged on the multi-color substrate 57 are fixed to face toward the target substrate 70. In this case, in each micro LED, an anode electrode A and a cathode electrode C are exposed to face toward a top surface of the target substrate 70, and the anode electrode A and the cathode electrode C may be joined with a plurality of electrodes 71a, 71b, 72a, 72b, 73a, 73b (refer to FIG. 7) on the target substrate 70 when transferred to the target substrate 70.

A mask 60 is arranged on an upper side of the multi-color substrate 57. On the mask 60, a plurality of openings 61 through which a laser beam passes may be formed, such that a laser beam may be irradiated on only a specific area of the multi-color substrate 57.

On the upper side of the mask 60, a laser generator (not shown) configured to irradiate a laser beam toward the multi-color substrate 57b may be arranged.

The multi-color substrate 57 and the target substrate 70 are respectively fixed to different stages controlled by the processor 40. In this state, the processor 40 may control each stage and move the multi-color substrate 57 and the target substrate 70 to transfer locations.

When the multi-color substrate 57 and the target substrate 70 are set in the transfer locations, a laser beam is irradiated from the laser generator toward the multi-color substrate 57.

Referring to FIG. 5, when a laser beam is irradiated on a predetermined area of the multi-color substrate 57 through the plurality of openings 61 of the mask 60, the plurality of blue, red, and green micro LEDs 51a, 51b, 51c corresponding to each opening are separated from a buffer layer 58 by the heat of the laser beam and are seated on the target substrate 70. Also, the plurality of micro LEDs 51a, 51b, 51c transferred to the target substrate 70 may respectively be fused with the plurality of electrodes 71a, 71b, 72a, 72b, 73a, 73b (refer to FIG. 7) on the target substrate 70 by the heat by the laser beam, and are electronically connected and fixed at the same time.

Referring to FIGS. 6-7, during one time transfer operation of the plurality of micro LEDs as described above is performed, empty spaces of the plurality of micro LEDs separated from the multi-color substrate 57 may correspond to a pitch P1 among the display pixels in the Y axis direction of the target substrate 70 illustrated in FIG. 7. Here, the display pixels may include three sub pixels of blue, red, and green micro LEDs 51a, 51b, 51c.

The plurality of micro LEDs of the multi-color substrate 57 may be arranged at specific pitches respectively in the X axis direction and the Y axis direction.

In case a laser beam performs line scanning by one row in the Y axis direction during the one time operation of transfer, it is desirable that the pitch of the plurality of micro LEDs of the multi-color substrate 57 in the Y axis direction is set in consideration of the pitch P1 (the pitch in the Y axis direction) among the display pixels of the target substrate 70.

In a case where the multi-color substrate 57 and the target substrate 70 are moved to next transfer locations after the one time operation of transfer and the next transfer operation is performed, it may not be necessary to consider a display pitch P2 (the pitch in the X axis direction) of the target substrate 70 for the pitch of the plurality of micro LEDs of the multi-color substrate 57 in the X axis direction.

Referring to FIG. 7, on the target substrate 70, a plurality of electrodes 71a, 71b, 72a, 72b, 73a, 73b may be formed at specific intervals in consideration of the pitch P1 in the Y axis direction and the pitch P2 in the X axis direction.

The target substrate 70 may include a transparent substrate, a TFT layer laminated on a first surface of the transparent substrate, and a plurality of wirings formed on a second surface of the transparent substrate, although not illustrated in the drawings. The plurality of electrodes 71a, 71b, 72a, 72b, 73a, 73b of the target substrate 70 to which the plurality of micro LEDs 51a, 51b, 51c are connected may be electrodes formed on the TFT layer.

The pattern of the plurality of multi-color micro LEDs does not necessarily have to be the same pattern as the aforementioned pattern of the multi-color substrate 57. For example, patterns formed on the multi-color substrate 57 may be formed in various ways depending on embodiments, and in an example embodiment, the pattern of the multi-color substrate 57 may be such that the red, green, and blue micro LEDs are arranged alternatingly along the Y-axis direction in a group of two rows or three rows. However, this is merely an example and the disclosure is not limited thereto.

Hereinafter, examples of multi-color substrates constituting various color patterns and target substrates corresponding to respective multi-color substrates will be described with reference to the drawings.

FIGS. 8 to 19 are diagrams illustrating various examples of transfer substrates having various color arrangements and target substrates corresponding to the transfer substrates according to example embodiments.

Figure 8:
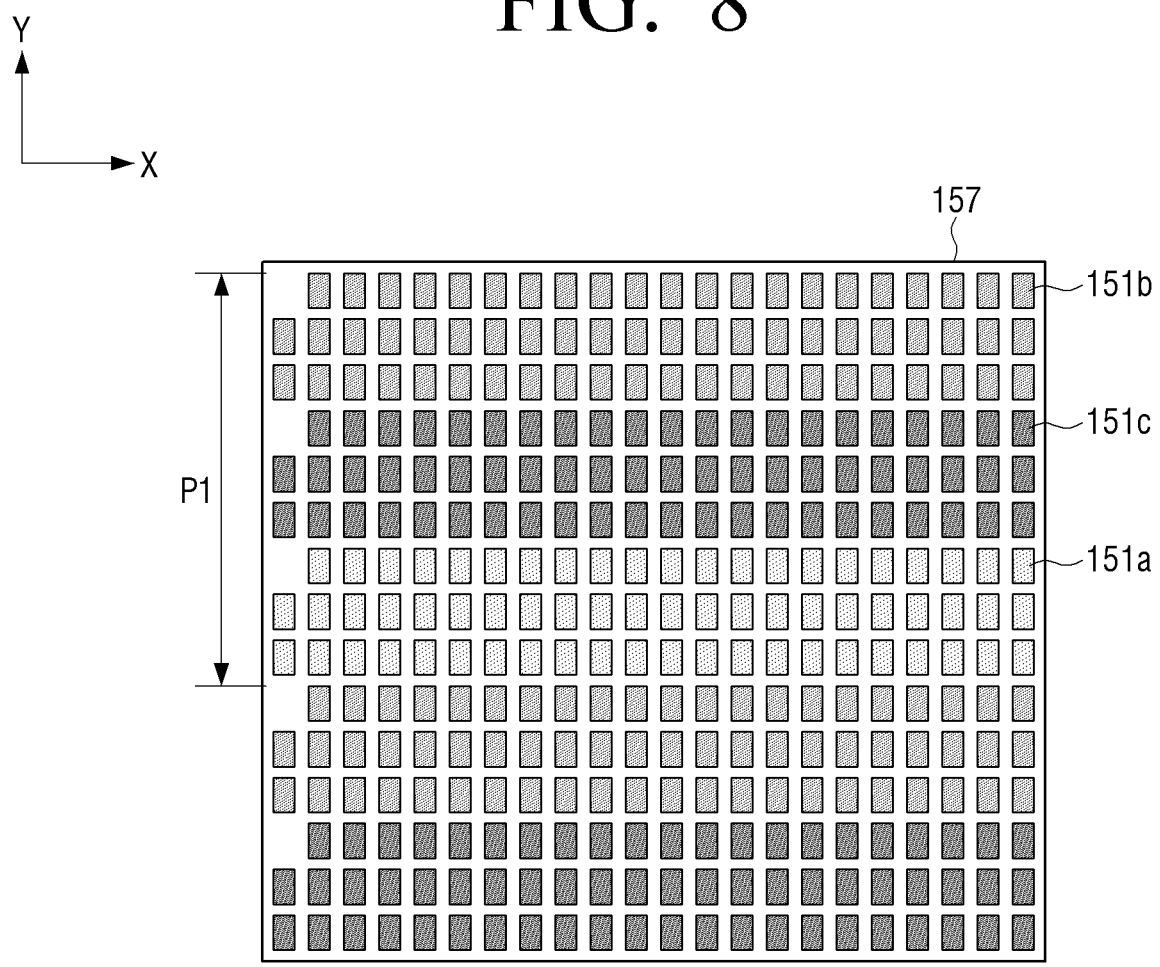
FIG. 8 is a diagram illustrating an example of a color arrangement of a transfer substrate according to an example embodiment.
Figure 9:
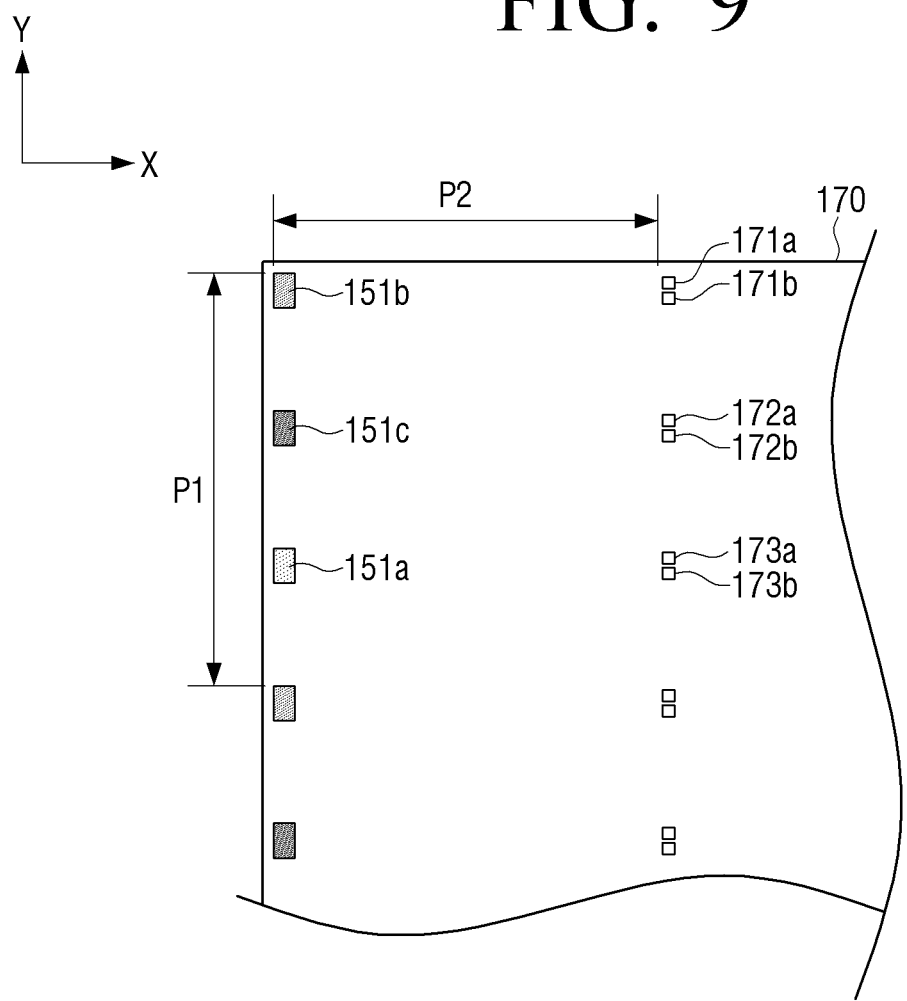
FIG. 9 is a diagram illustrating an example of a target substrate corresponding to the color arrangement of the transfer substrate as shown in FIG. 8.

FIG. 8 is a diagram illustrating an example of a color arrangement of a transfer substrate according to an example embodiment, and FIG. 9 is a diagram illustrating an example of a target substrate corresponding to the color arrangement of the transfer substrate as shown in FIG. 8.

It is desirable that the pattern of the plurality of multi-color micro LEDs of a multi-color substrate 157 is based on locations and colors of each micro LED transferred to a target substrate 170. Hereinafter, examples of various color patterns of multi-color substrates and examples of various transfer patterns by multi-color substrates in each color pattern will be described.

FIG. 8 illustrates a multi-color substrate 157 in a state in which some micro LEDs have been transferred to the target substrate 170 after one time operation of transfer.

Referring to FIG. 8, with respect to the color arrangement of the plurality of micro LEDs formed on the multi-color substrate 157, there is a pattern such that three rows of red micro LEDs 151b are consecutively arranged, and then three rows of green micro LEDs 151c are arranged in the Y axis direction, and then three rows of blue micro LEDs 151a are arranged in the Y axis direction. In this case, the pattern of the multi-color substrate 157 is such that the red, green, and blue micro LEDs may be repetitively arranged alternatingly in a group of three rows.

The color pattern of the multi-color substrate 157 as described above may be formed by applying color conversion materials on a predetermined location through the aforementioned color conversion process by using the mono-color substrate 50.

Referring to FIG. 9, on the target substrate 170, a plurality of electrodes 171a, 171b, 172a, 172b, 173a, 173b are respectively formed in locations corresponding to the pitches P1, P2 in the X axis and Y axis directions.

During one time operation of transfer, a plurality of micro LEDs 151a, 151b, 151c in different colors corresponding to one column are transferred together to the target substrate 170 from the multi-color substrate 157, and the plurality of transferred micro LEDs 151a, 151b, 151c are electronically connected with the plurality of electrodes 171a, 171b, 172a, 172b, 173a, 173b, respectively.

In this case, one pixel of the target substrate 170 may include sub pixels of the blue, red, and green micro LEDs 151a, 151b, 151c. Accordingly, during one time operation of transfer, at least two pixels may be formed to have the pitch P1 in the Y axis direction on the target substrate 170.

The pitch P1 in the Y axis direction and the pitch P2 in the X axis direction of the target substrate 170 may be set to be the same or set to be different according to the design condition or specific purpose of the display module. Also, the color pattern of the multi-color substrate 157 may be different from the aforementioned color pattern of the multi-color substrate 57, and the transfer pattern in which the micro LEDs 151a, 151b, 151c are transferred to the target substrate 170 may also be different from the aforementioned transfer pattern.

As described above, a plurality of micro LEDs in different colors of the multi-color substrate 157 are transferred to the target substrate 170 in one time operation of a transfer process, and thus manufacturing efficiency and speed of a display module may be maximized compared to the related art technology.

Figure 10:
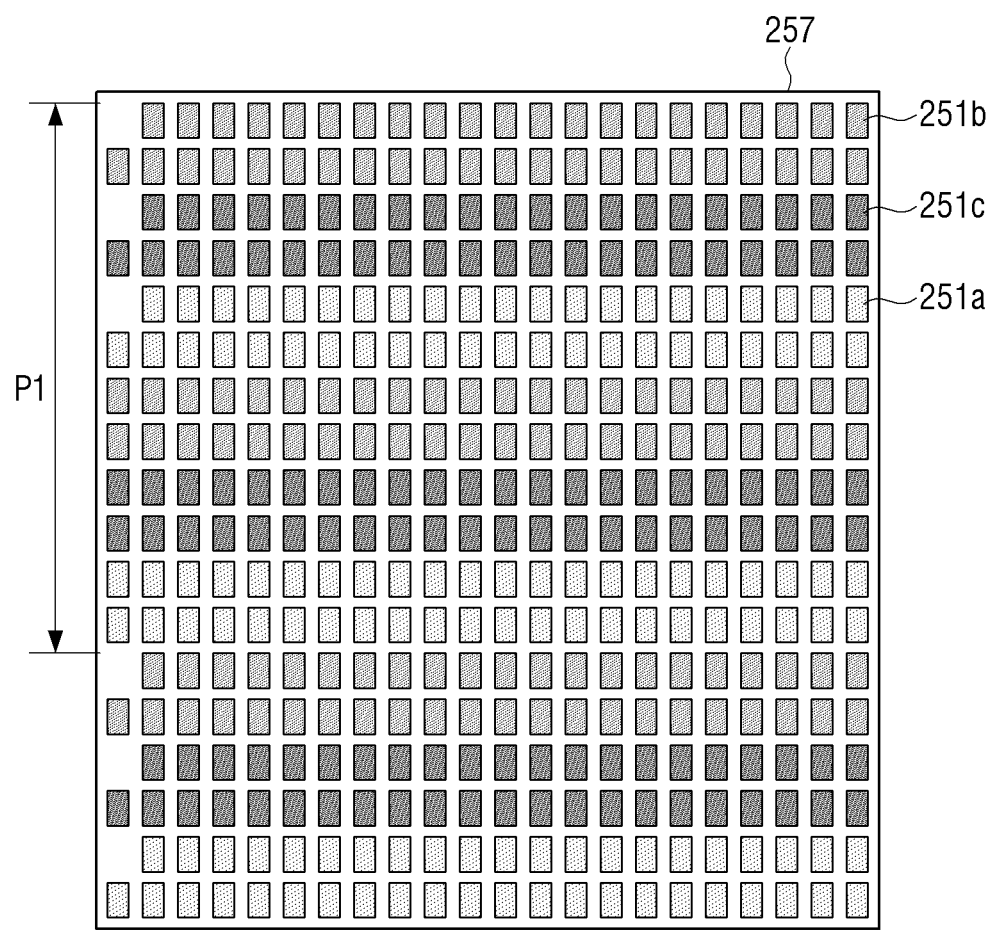
FIG. 10 is a diagram illustrating an example of a color arrangement of a transfer substrate according to an example embodiment.
Figure 11:
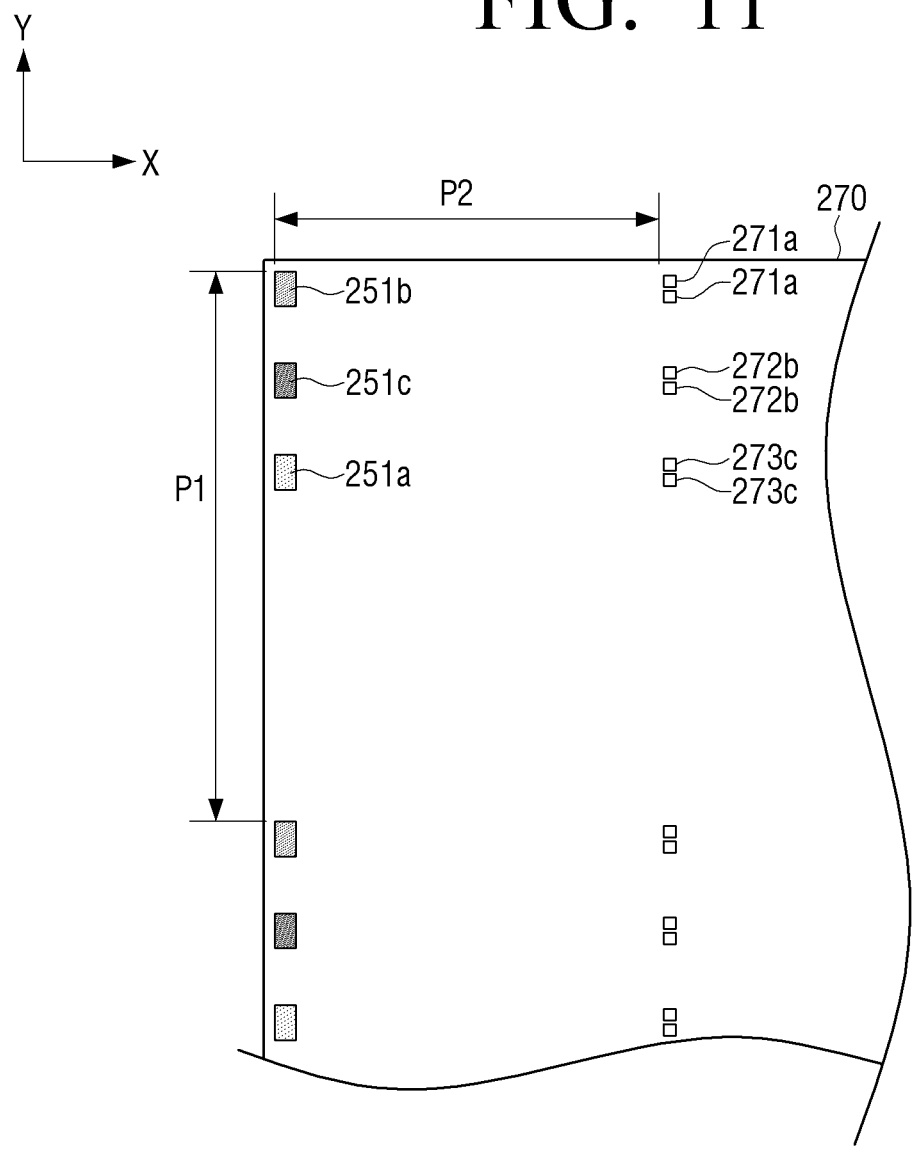
FIG. 11 is a diagram illustrating an example of a target substrate corresponding to the color arrangement of the transfer substrate as shown in FIG. 10.

FIG. 10 is a diagram illustrating an example of a color arrangement of a transfer substrate according to an example embodiment, and FIG. 11 is a diagram illustrating an example of a target substrate corresponding to the color arrangement of the transfer substrate as shown in FIG. 10.

FIG. 10 illustrates a multi-color substrate 257 in a state in which some micro LEDs have been transferred to a target substrate 270 after one time operation of transfer.

Referring to FIG. 10, with respect to the color arrangement of the plurality of micro LEDs formed on the multi-color substrate 257, there is a pattern in which two rows of red micro LEDs 251b are consecutively arranged, and then two rows of green micro LEDs 251c are arranged in the Y axis direction, and then two rows of blue micro LEDs 251a are arranged in the Y axis direction. In this case, the pattern of the multi-color substrate 257 is such that the red, green, and blue micro LEDs may be repetitively arranged alternatingly in a group of two rows.

The color pattern of the multi-color substrate 257 as described above may be formed by applying color conversion materials on a predetermined location through the aforementioned color conversion process by using the mono-color substrate 50.

Referring to FIG. 11, on the target substrate 270, a plurality of electrodes 271a, 271b, 272a, 272b, 273a, 273b are respectively formed in locations corresponding to the pitches P1, P2 in the X axis and Y axis directions.

During one time operation of transfer, a plurality of micro LEDs 251a, 251b, 251c in different colors are transferred together by one column to the target substrate 270 from the multi-color substrate 257, and the plurality of transferred micro LEDs 251a, 251b, 251c are electronically connected with the plurality of electrodes 271a, 271b, 272a, 272b, 273a, 273b, respectively.

In this case, one pixel of the target substrate 270 may include sub pixels of the blue, red, and green micro LEDs 251a, 251b, 251c. Accordingly, during one time operation of transfer, at least two pixels may be formed to have the pitch P1 in the Y axis direction on the target substrate 270.

The pitch P1 in the Y axis direction on the target substrate 270 illustrated in FIG. 11 may be bigger than the aforementioned pitch P1 in the Y axis direction on the target substrate 170 illustrated in FIG. 9. Also, the pitch P1 in the Y axis direction of the target substrate 270 may be set to be the same as or different from the pitch P2 in the X axis direction according to the design condition or specific purpose of the display module.

Figure 12:
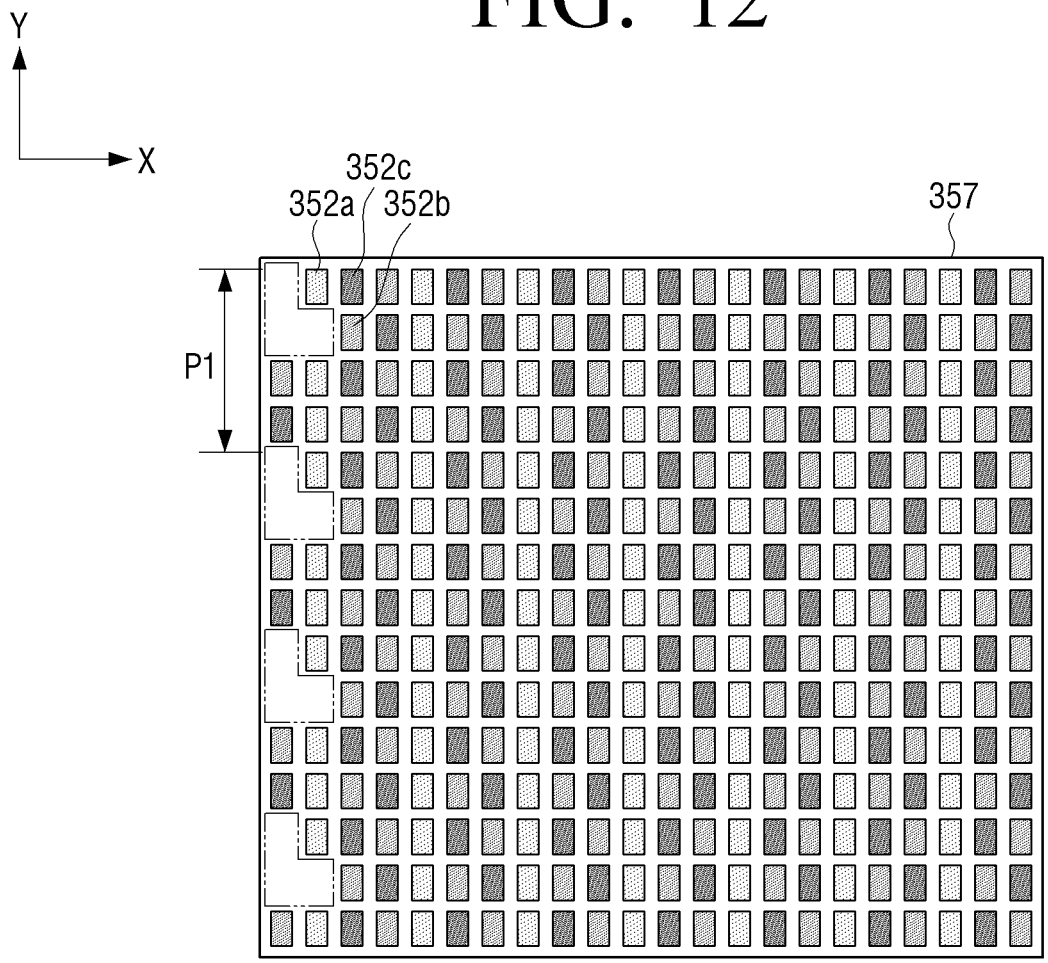
FIG. 12 is a diagram illustrating an example of a color arrangement of a transfer substrate according to an example embodiment.
Figure 13:
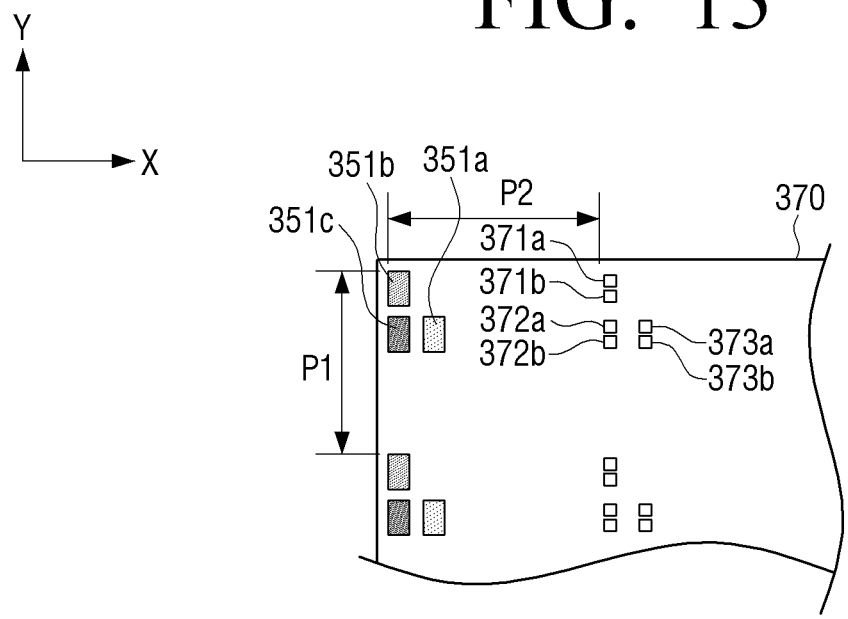
FIG. 13 is a diagram illustrating an example of a target substrate corresponding to the color arrangement of the transfer substrate as shown in FIG. 12.

FIG. 12 is a diagram illustrating an example of a color arrangement of a transfer substrate according to an example embodiment, and FIG. 13 is a diagram illustrating an example of a target substrate corresponding to the color arrangement of the transfer substrate as shown in FIG. 12.

FIG. 12 illustrates a multi-color substrate 357 in a state in which some micro LEDs have been transferred to a target substrate 370 after one time operation of transfer.

Referring to FIG. 12, with respect to the color arrangement of the plurality of micro LEDs formed on the multi-color substrate 357, there is a pattern in which micro LEDs are arranged in an order of a red micro LEDs 352b, a blue micro LEDs 352a, and a green micro LEDs 352c in a first row, and arranged in an order of the green micro LEDs 351c, the blue micro LEDs 351a, and the red micro LEDs 351b in a second row. In this case, the pattern of the multi-color substrate 357 may include the patterns of the above first and second rows that are repetitively arranged in every two rows in the Y axis direction.

The color pattern of the multi-color substrate 357 as described above may be formed by applying color conversion materials on a predetermined location through the aforementioned color conversion process by using the mono-color substrate 50.

Referring to FIG. 13, on the target substrate 370, a plurality of electrodes 371a, 371b, 372a, 372b, 373a, 373b are respectively formed in locations corresponding to the pitches P1, P2 in the X axis and Y axis directions.

During one time operation of transfer, a plurality of micro LEDs 351a, 351b, 351c in different colors constituting a pattern in the shape of the character 1' among the micro LEDs (that is, the micro LEDs 351b and 351c in a first column and a micro LED 351c in a second column) are transferred together to the target substrate 370 from the multi-color substrate 357. The plurality of micro LEDs 351a, 351b, 351c transferred to the target substrate 370 may be electronically connected with the plurality of electrodes 371a, 371b, 372a, 372b, 373a, 373b, respectively.

In the case where the three micro LEDs 351a, 351b, 351c corresponding to the sub pixels are transferred in a pattern in the shape of the character 1' as shown in FIG. 13, three micro LEDs 352a, 352b, 352c as shown in FIG. 12 that are adjacent to the three transferred micro LEDs 351a, 351b, 351c in the X axis direction may be arranged in a pattern in an inversed shape of the character 'L.'

Accordingly, the multi-color substrate 357 may be rotated by 180 degrees on the X-Y plane to transfer the plurality of micro LEDs 352a, 352b, 352c having the pattern in the inversed shape of the character 1' on the multi-color substrate 357 to the target substrate 370. Accordingly, after rotation, the plurality of micro LEDs 352a, 352b, 352c having the pattern in the inversed shape of the character 1' on the multi-color substrate 357 may be arranged in a pattern in the shape of the character 'L.' In this state, the plurality of micro LEDs 352a, 352b, 352c arranged in the pattern in the shape of the character 1' may be transferred from the multi-color substrate 357 to the target substrate 370.

In this case, the first pixel of the target substrate 370 may include sub pixels of the blue, red, and green blue micro LEDs 351a, 351b, 351c. Accordingly, during one time operation of transfer, at least two pixels may be formed to have the pitch P1 in the Y axis direction on the target substrate 370.

The pitch P1 in the Y axis direction on the target substrate 370 illustrated in FIG. 13 may be set to be the same as or different from the pitch P2 in the X axis direction according to the design condition or specific purpose of the display module.

Figure 14:
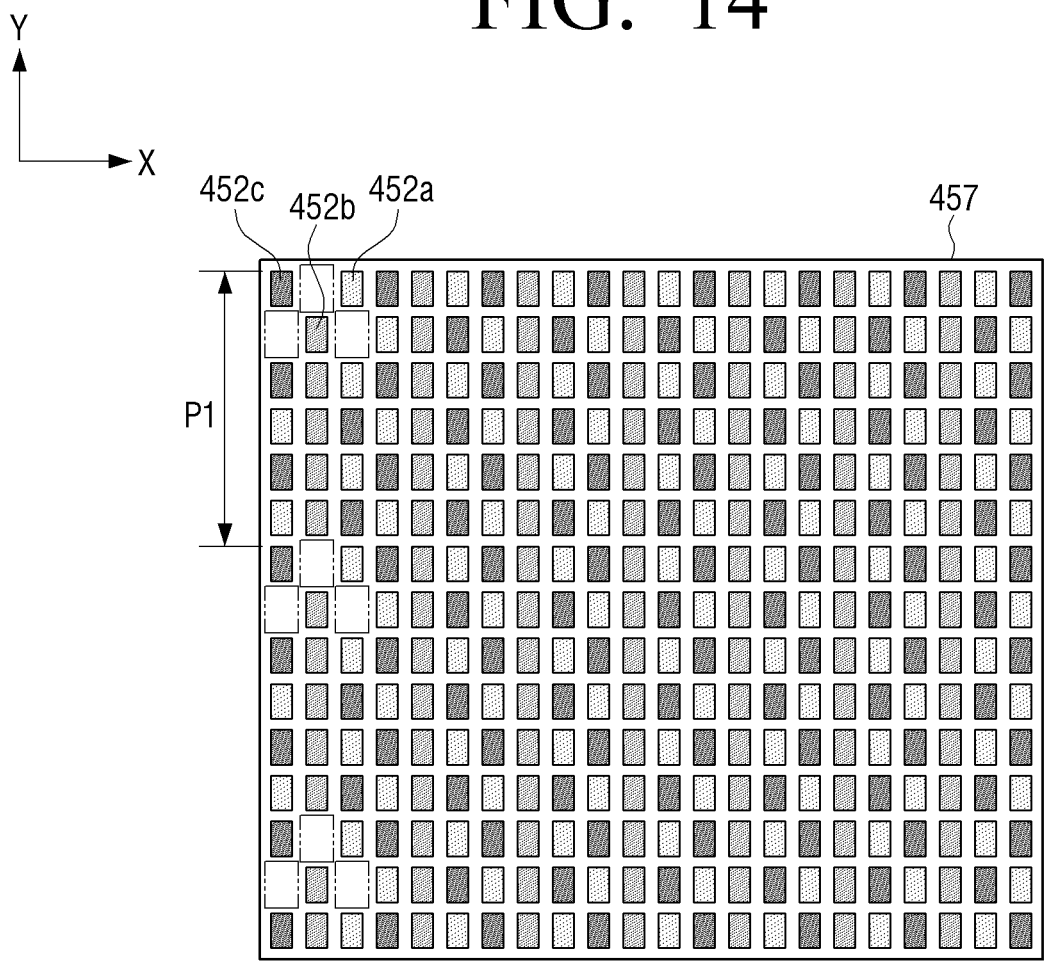
FIG. 14 is a diagram an example of a color arrangement of a transfer substrate according to an example embodiment.
Figure 15:
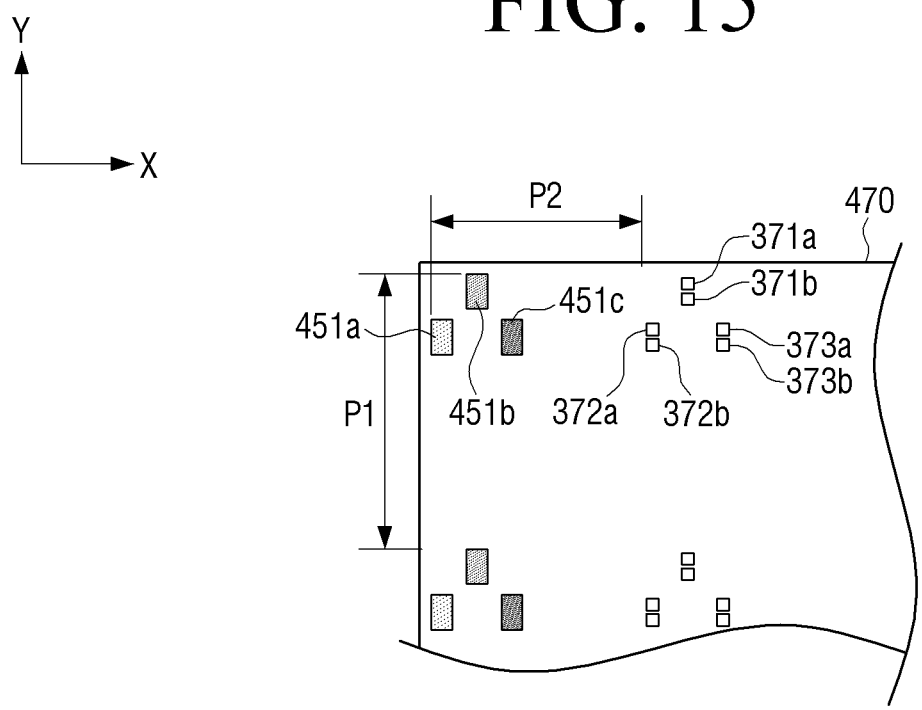
FIG. 15 is a diagram illustrating an example of a target substrate corresponding to the color arrangement of the transfer substrate as shown in FIG. 14.

FIG. 14 is a diagram illustrating an example of a color arrangement of a transfer substrate according to an example embodiment, and FIG. 15 is a diagram illustrating an example of a target substrate corresponding to the color arrangement of the transfer substrate as shown in FIG. 14.

FIG. 14 illustrates a multi-color substrate 457 in a state in which some micro LEDs have been transferred to a target substrate 470 after one time operation of transfer.

Referring to FIG. 14, with respect to the color arrangement of the plurality of micro LEDs formed on the multi-color substrate 457, there is a pattern such that the plurality of micro LEDs are arranged in an order of a green micro LEDs 452c, a red micro LEDs 452b, and a blue micro LEDs 452a in a first row, and arranged in an order of the blue micro LEDs 4512, the red micro LEDs 452b, and the green micro LEDs 452c in a second row. In this case, the pattern of the multi-color substrate 457 may include the patterns of the above first and second rows that are repetitively arranged in every two rows in the Y axis direction.

The color pattern of the multi-color substrate 457 as described above may be formed by applying color conversion materials on a predetermined location through the aforementioned color conversion process by using the mono-color substrate 50.

Referring to FIG. 15, on the target substrate 470, a plurality of electrodes 471a, 471b, 472a, 472b, 473a, 473b are respectively formed in locations corresponding to the pitches P1, P2 in the X axis and Y axis directions.

During one time operation of transfer, a plurality of micro LEDs 451a, 451b, 451c in different colors constituting a triangle pattern among the micro LEDs corresponding to two rows and three columns are transferred together to the target substrate 470 from the multi-color substrate 457. The plurality of micro LEDs 451a, 451b, 451c transferred to the target substrate 470 may be electronically connected with the plurality of electrodes 471a, 471b, 472a, 472b, 473a, 473b, respectively.

In the case where the three micro LEDs 451a, 451b, 451c corresponding to the sub pixels are transferred in a triangle pattern as shown in FIG. 15, the three micro LEDs 452a, 452b, 452c arranged to crisscross the three transferred micro LEDs 451a, 451b, 451c may be arranged in an inverse-triangle pattern.

Accordingly, to transfer the plurality of micro LEDs 452a, 452b, 452c having an inverse-triangle pattern on the multi-color substrate 457 to the target substrate 470, the multi-color substrate 457 may be rotated by 180 degrees on the X-Y plane. Accordingly, after rotation, the plurality of micro LEDs 452a, 452b, 452c having an inverse-triangle pattern on the multi-color substrate 457 may be arranged in a triangle pattern. In this state, the plurality of micro LEDs 452a, 452b, 452c arranged in a triangle pattern may be transferred from the multi-color substrate 457 to the target substrate 470.

In this case, one pixel of the target substrate 470 may include sub pixels of the red, green, and blue micro LEDs 451a, 451b, 451c. Accordingly, during one time operation of transfer, at least two pixels may be formed to have the pitch P1 in the Y axis direction on the target substrate 470.

The pitch P1 in the Y axis direction on the target substrate 470 illustrated in FIG. 15 may be set to be the same as or different from the pitch P2 in the X axis direction of the target substrate 470 according to the design condition or specific purpose of the display module.

Figure 16:
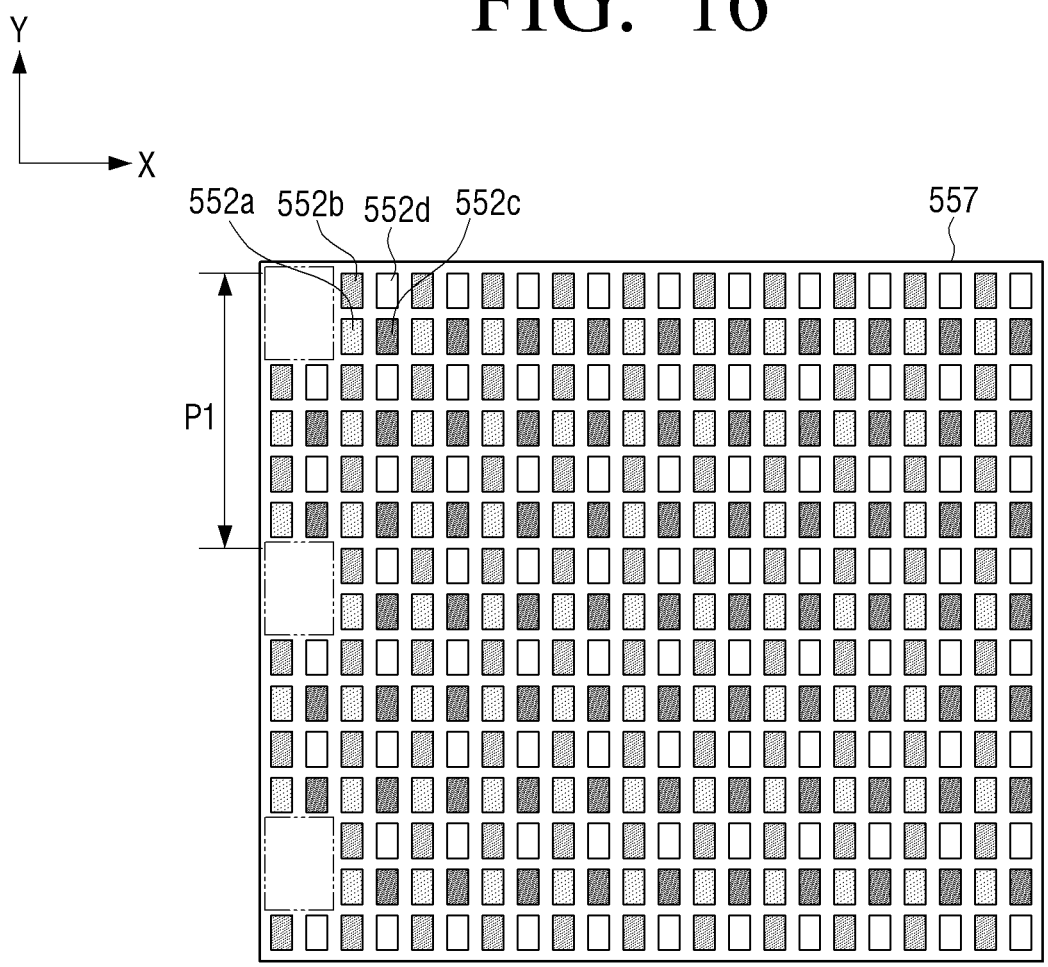
FIG. 16 is a diagram illustrating an example of a color arrangement of a transfer substrate according to an example embodiment.
Figure 17:
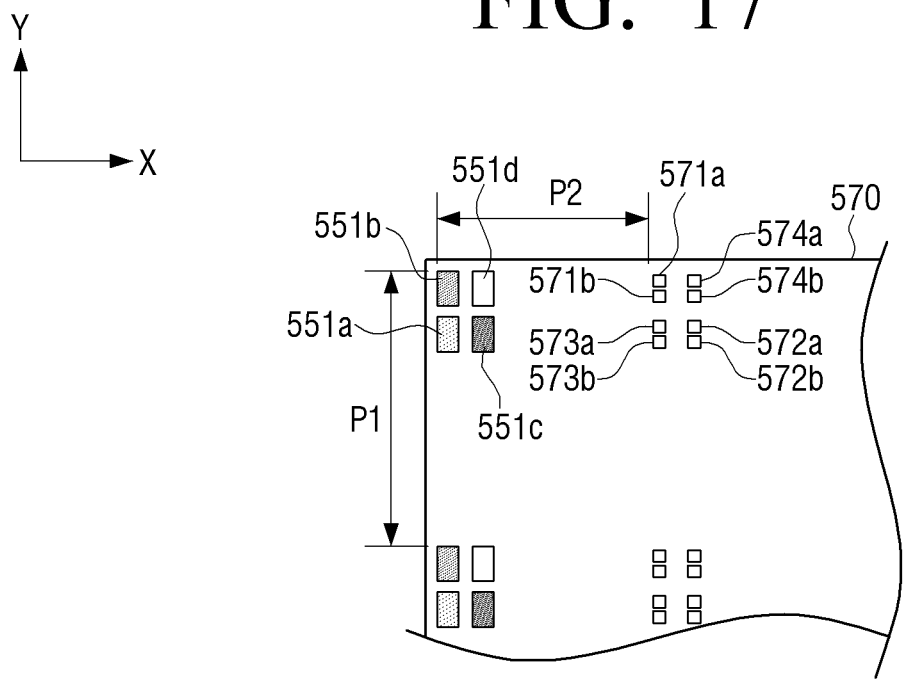
FIG. 17 is a diagram illustrating an example of a target substrate corresponding to the color arrangement of the transfer substrate as shown in FIG. 16.

FIG. 16 is a diagram illustrating an example of a color arrangement of a transfer substrate according to an example embodiment, and FIG. 17 is a diagram illustrating an example of a target substrate corresponding to the color arrangement of the transfer substrate as shown in FIG. 16.

FIG. 16 illustrates a multi-color substrate 557 in a state in which some micro LEDs have been transferred to a target substrate 570 after one time operation of transfer.

Referring to FIG. 16, with respect to the color arrangement of the plurality of micro LEDs formed on the multi-color substrate 557, there is a pattern such that the plurality of micro LEDs are arranged in an order of a red micro LEDs 552b, and a white micro LEDs 552d in a first low, and arranged in an order of a blue micro LEDs 552a, and a green micro LEDs 552c in a second row. In this case, the pattern of the multi-color substrate 557 may include the patterns of the above first and second rows that are repetitively arranged in every two rows in the Y axis direction.

The color pattern of the multi-color substrate 557 as described above may be formed by applying color conversion materials on a predetermined location through the aforementioned color conversion process by using the mono-color substrate 50.

Referring to FIG. 17, on the target substrate 570, a plurality of electrodes 571a, 571b, 572a, 572b, 573a, 573b, 574a, 574b are respectively formed in locations corresponding to the pitches P1, P2 in the X axis and Y axis directions.

During one time operation of transfer, a plurality of micro LEDs 551a, 551b, 551c, 551d in different colors constituting a square pattern among the micro LEDs corresponding to two rows and two columns are transferred together to the target substrate 570 from the multi-color substrate 557. The plurality of micro LEDs 551a, 551b, 551c, 551d transferred to the target substrate 570 may be electronically connected with the plurality of electrodes 571a, 571b, 572a, 572b, 573a, 573b, 574a, 574b, respectively.

In the case where the four micro LEDs 551a, 551b, 551c, 551d corresponding to the sub pixels are transferred in a square pattern as shown in FIG. 17, the four micro LEDs 552a, 552b, 552c, 552d arranged to be adjacent to the four transferred micro LEDs 551a, 551b, 551c, 551d in the X axis direction may also be arranged in a square pattern.

One pixel of the target substrate 570 may include sub pixels of the blue, red, green, and white micro LEDs 551a, 551b, 551c, 551d. Accordingly, during one time operation of transfer, at least two pixels may be formed to have the pitch P1 in the Y axis direction on the target substrate 570.

The pitch P1 in the Y axis direction on the target substrate 570 illustrated in FIG. 17 may be set to be the same as or different from the pitch P2 in the X axis direction of the target substrate 570 according to the design condition or specific purpose of the display module.

Figure 18:
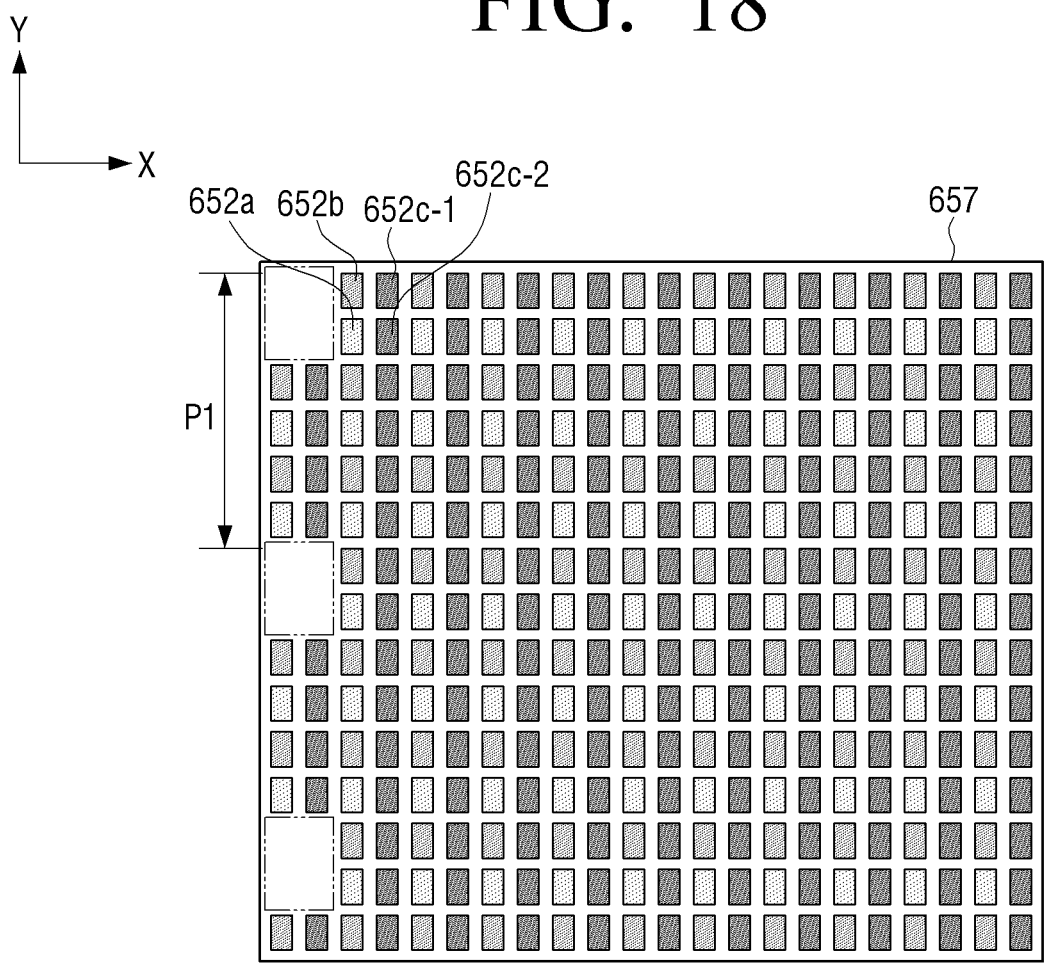
FIG. 18 is a diagram illustrating an example of a color arrangement of a transfer substrate according to an example embodiment.
Figure 19:
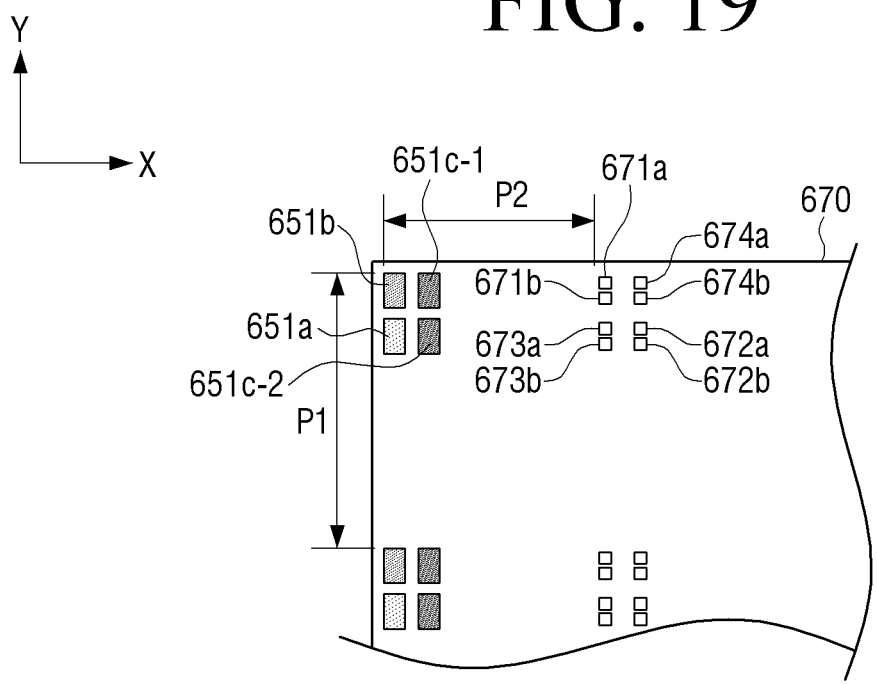
FIG. 19 is a diagram illustrating an example of a target substrate corresponding to the color arrangement of the transfer substrate as shown in FIG. 18.

FIG. 18 is a diagram illustrating an example of a color arrangement of a transfer substrate according to an example embodiment, and FIG. 19 is a diagram illustrating an example of a target substrate corresponding to the color arrangement of the transfer substrate as shown in FIG. 18.

FIG. 18 illustrates a multi-color substrate 657 in a state in which some micro LEDs have been transferred to a target substrate 670 after one time operation of transfer.

Referring to FIG. 18, with respect to the color arrangement of the plurality of micro LEDs formed on the multi-color substrate 657, there is a pattern such that the plurality of micro LEDs are arranged in an order of a red micro LEDs 652b, and a first green micro LEDs 652-c in a first low, and arranged in an order of a blue micro LEDs 652a, and a second green micro LEDs 651c-2 in a second row. In this case, the pattern of the multi-color substrate 657 may include the patterns of the above first and second rows that are repetitively arranged in every two rows in the Y axis direction.

The color pattern of the multi-color substrate 657 as described above may be formed by applying color conversion materials on a predetermined location through the aforementioned color conversion process by using the mono-color substrate 50.

Referring to FIG. 19, on the target substrate 670, a plurality of electrodes 671a, 671b, 672a, 672b, 673a, 673b, 674a, 674b are respectively formed in locations corresponding to the pitches P1, P2 in the X axis and Y axis directions.

During one time operation of transfer, a plurality of micro LEDs 651a, 651b, 651c-1, 651c-2 in different colors constituting a square pattern among the micro LEDs corresponding to two rows and two columns are transferred together to the target substrate 670 from the multi-color substrate 657. The plurality of micro LEDs 651a, 651b, 651c-1, 651c-2 transferred to the target substrate 670 may be electronically connected with the plurality of electrodes 671a, 671b, 672a, 672b, 673a, 673b, 674a, 674b, respectively.

In the case where the four micro LEDs 651a, 651b, 651c-1, 651c-2 corresponding to the sub pixels are transferred in a square pattern as shown in FIG. 19, the four micro LEDs 652a, 652b, 652c-1, 652c-2 arranged to be adjacent to the four transferred micro LEDs 651a, 651b, 651c-1, 651c-2 in the X axis direction may also be arranged in a square pattern.

One pixel of the target substrate 670 may include sub pixels of the blue, red, green, and white micro LEDs 651a, 651b, 651c-1, 651c-2. Accordingly, during one time operation of transfer, at least two pixels may be formed to have the pitch P1 in the Y axis direction on the target substrate 670.

The pitch P1 in the Y axis direction on the target substrate 670 illustrated in FIG. 19 may be set to be the same as or different from the pitch P2 in the X axis direction of the target substrate 670 according to the design condition or specific purpose of the display module.

Figure 20:
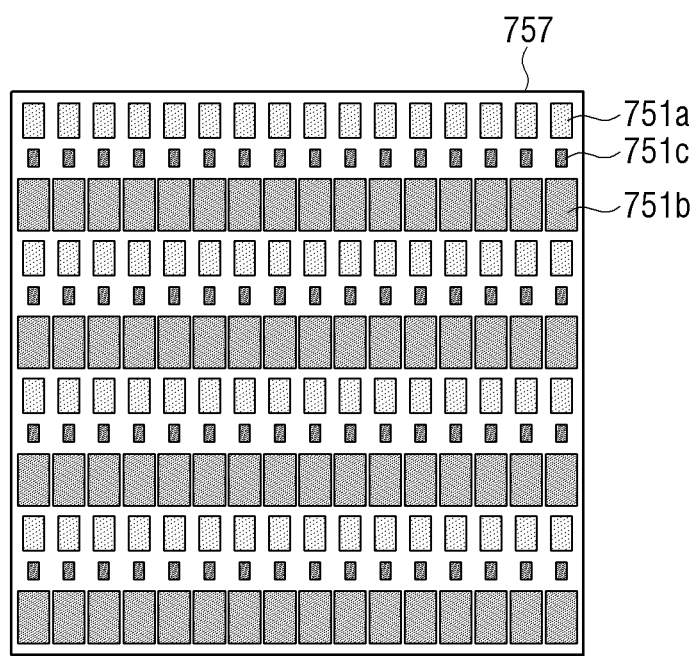
FIG. 20 is a diagram illustrating a multi-color substrate according to another example embodiment.
Figure 21:
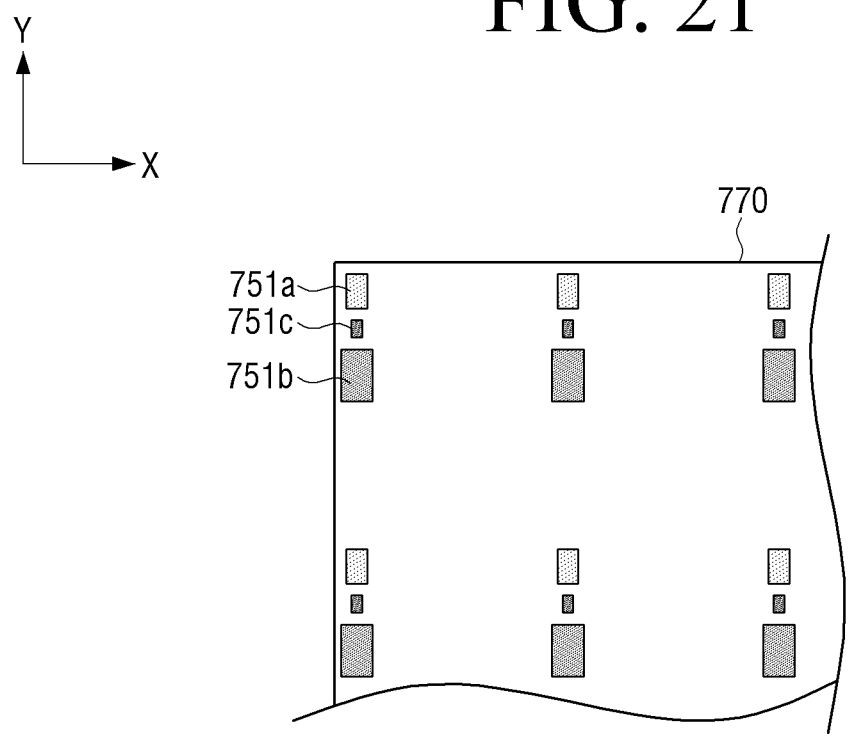
FIG. 21 is a diagram illustrating an example in which a plurality of micro LEDs are transferred to a target substrate from a multi-color substrate according to another example embodiment.

FIG. 20 is a diagram illustrating a multi-color substrate according to another example embodiment, and FIG. 21 is a diagram illustrating an example in which a plurality of micro LEDs are transferred to a target substrate from a multi-color substrate according to another example embodiment.

The size of a multi-color substrate according to the disclosure may be formed to vary according to the brightness required for a plurality of multi-color micro LEDs.

Referring to FIG. 20, the ratios between a size of a red micro LEDs 751b, a size of a green micro LEDs 751c, and a size of a blue micro LEDs 751a may be formed to be different from one another. In an example embodiment, the size of the red micro LEDs 751b may be greatest among the micro LEDs 751a, 751b, 751c, and the size of the green micro LEDs 751c may be smallest among the micro LEDs 751a, 751b, 751c.

Referring to FIG. 21, on a target substrate 770, a plurality of single pixels including one of each of the red micro LED 751b, the green micro LED 751c, and the blue micro LED 751a which are sub pixels may be arranged at specific pitches. In this case, the plurality of single pixels may be transferred together to predetermined locations on the target substrate 770 from a multi-color substrate 757.

Figure 22:
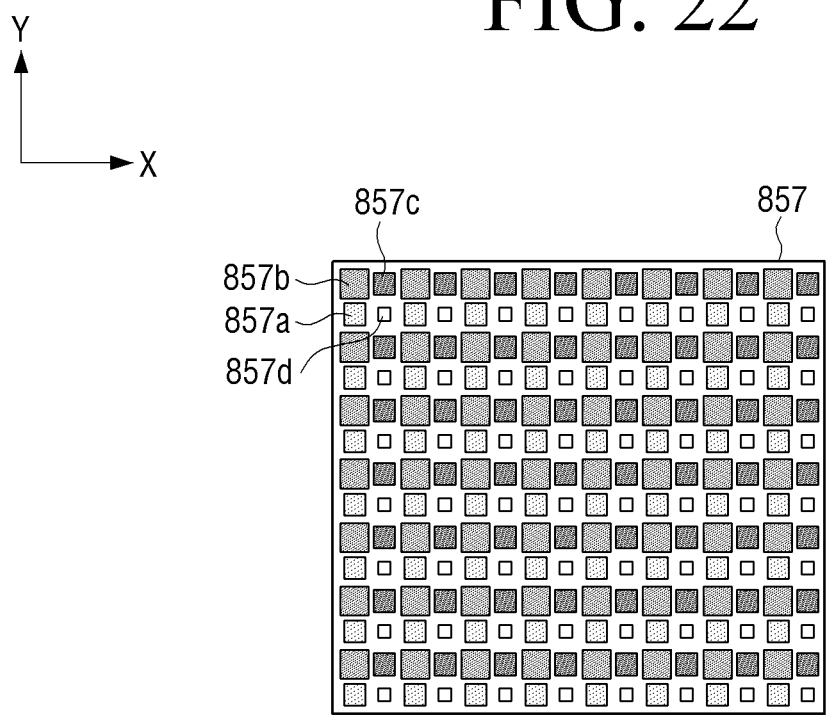
FIG. 22 is a diagram illustrating a multi-color substrate according to still another example embodiment.
Figure 23:
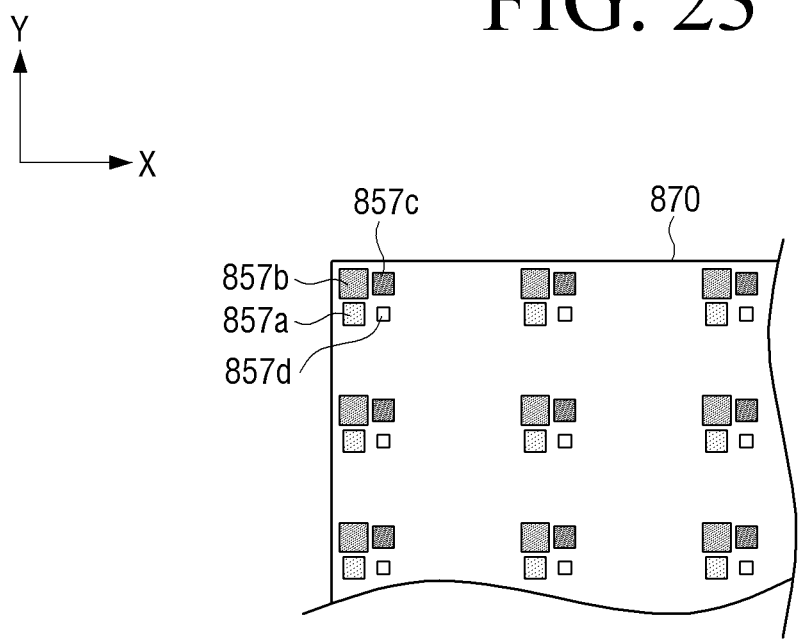
FIG. 23 is a diagram illustrating an example in which a plurality of micro LEDs are transferred to a target substrate from a multi-color substrate according to still another example embodiment.

FIG. 22 is a diagram illustrating a multi-color substrate according to still another example embodiment, and FIG. 23 is a diagram illustrating an example in which a plurality of micro LEDs are transferred to a target substrate from a multi-color substrate according to still another example embodiment.

Referring to FIG. 22, a multi-color substrate 857 may include a plurality of micro LEDs on which color conversion materials are applied so that the micro LEDs emit different colors. In this case, the plurality of micro LEDs may include red micro LEDs 857b, green micro LEDs 857c, blue micro LEDs 857a, and white micro LEDs 857d.

In this case, the ratios between a size of the micro LEDs 857a, a size of the micro LEDs 857b, a size of the micro LEDs 857c, and a size of the micro LEDs 857d in different colors may be formed to be different from one another. In an example embodiment, the size of the red micro LEDs 857b may be greatest among the micro LEDs 857a, 857b, 857c, 857d, the size of the white micro LEDs 857d may be formed to be smallest among the micro LEDs 857a, 857b, 857c, 857d, and the blue and green micro LEDs 857a, 857c may be formed to have the same size.

Referring to FIG. 23, on a target substrate 870, a plurality of single pixels including one of each of the red micro LED 857b, the green micro LED 857c, the blue micro LED 857a, and the white micro LED 857d which are sub pixels may be arranged at specific pitches. In this case, the plurality of single pixels may be transferred together to predetermined locations on the target substrate 870 from the multi-color substrate 857.

As described above, on the multi-color substrates 757, 857 according to the example embodiments, at least two or more of a plurality of micro LEDs may be grown to have different sizes, in consideration of different colors to be applied to the plurality of micro LEDs grown on the growth substrate.

A mono-color substrate manufactured by using a process as described above may be formed into a multi-color substrate including micro LEDs that represent at least two colors, as color conversion materials are applied on each micro LED corresponding to predetermined sizes.

Figure 24:
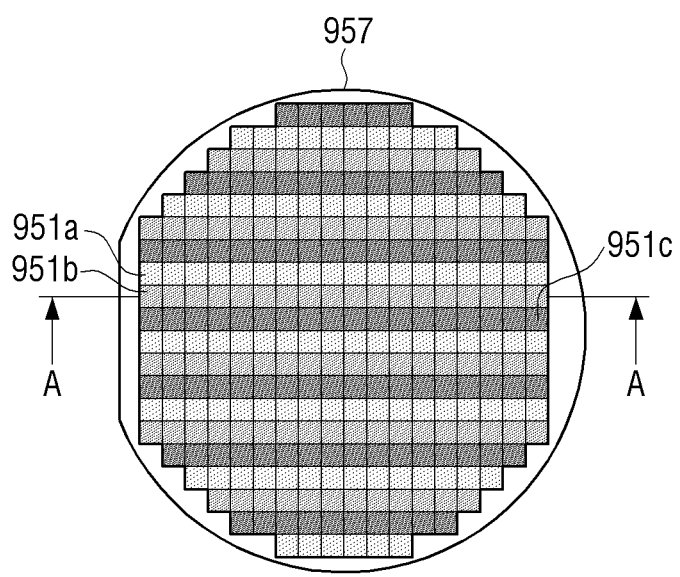
FIG. 24 is a diagram illustrating a multi-color substrate based on a different thickness in application of a color conversion material according to an example embodiment.
Figure 25:
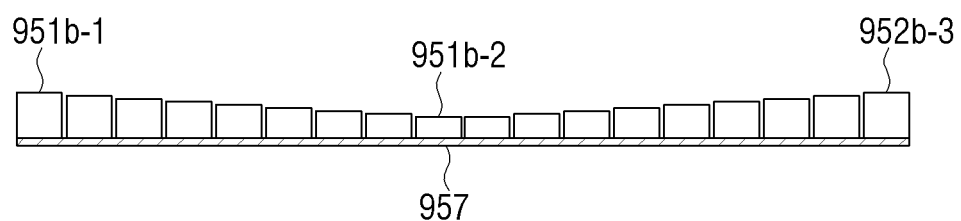
FIG. 25 is a cross-sectional view illustrated along the A-A line illustrated in FIG. 24.

FIG. 24 is a diagram illustrating a multi-color substrate based on a different thickness in application of a color conversion material according to an example embodiment, and FIG. 25 is a cross-sectional view illustrated along the A-A line illustrated in FIG. 24. FIG. 25 is a diagram illustrating an example in which the thickness in application of a color conversion becomes gradually thicker as the application location is more toward an outer rim of the multi-color substrate from a center portion of the multi-color substrate.

Because of the characteristic of the manufacturing process of a mono-color substrate, a phenomenon in which the characteristics of micro LEDs become degraded as the location is toward a farther portion (e.g., toward the outer rim portion of the mono-color substrate) from a portion of the mono-color substrate (e.g., the center portion of the mono-color substrate) may occur.

In this case, when forming a multi-color substrate 957 as shown in FIG. 24 by applying a color conversion material on a mono-color substrate, the thickness of the color conversion material to be applied to micro LEDs 951a, 951b, 951c may be adjusted by gradually increasing the amount of the color conversion material to be applied to the micro LEDs as the location of the micro LEDs is toward the outer rim portion of the mono-color substrate from the center portion of the mono-color substrate.

For example, among the micro LEDs 95 lb in the same color (e.g., the red color) on the multi-color substrate 957 as shown in FIG. 25, micro LEDs 951b-1, 951b-3 located in the outer rim portion may be thicker than micro LEDs 951b-2 located in the center portion. In this case, the height profile of the micro LEDs formed on the multi-color substrate 957 may be expressed as a shape which is generally concave toward the center.

By applying different thicknesses in applying a color conversion material according to the location of micro LEDs as described above, the electric field efficiency and the light efficiency of micro LEDs distributed in the outer rim portion of the multi-color substrate 957 may be improved, and the turn-on voltage may be lowered. Accordingly, by minimizing the deviation among each area of the multi-color substrate 957, the characteristics of micro LEDs arranged on the entire areas of the multi-color substrate 957 may be more uniform.

Figure 26:
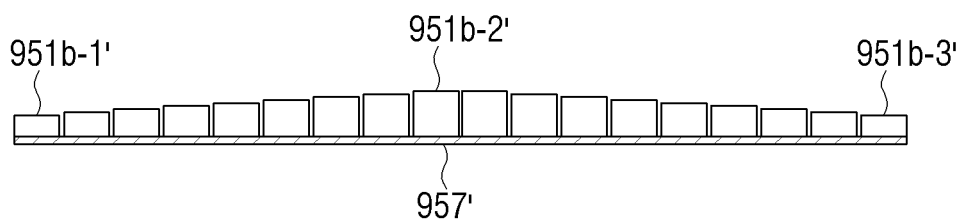
FIG. 26 is a diagram illustrating another example of a multi-color substrate based on a different thickness in application of a color conversion material according to another example embodiment.

FIG. 26 is a diagram illustrating a multi-color substrate based on a different thickness in application of a color conversion material according to another example embodiment. FIG. 26 is a diagram illustrating another example in which the thickness in application of the color conversion material becomes gradually thinner as the location of the micro LED is toward the outer rim of the multi-color substrate from the center portion of the multi-color substrate.

Because of the characteristic of the manufacturing process of a mono-color substrate, a phenomenon in which the characteristics of micro LEDs are degraded as the location is more toward the center portion of a mono-color substrate from the outer rim of the mono-color substrate may occur.

In this case, the thickness of a color conversion material to be applied to the micro LEDs may be adjusted by gradually increasing the amount of the color conversion material to be applied to the micro LEDs as the location of the micro LEDs is toward the center portion of a mono-color substrate from the outer rim portion of the mono-color substrate.

Referring to FIG. 26, in the case of the micro LEDs in the same color (e.g., the red color) on a multi-color substrate 957', micro LEDs 951b-1', 951b-3' located in the outer rim portion may be thinner than micro LEDs 951b-2' located in the center portion. In this case, the height profile of the micro LEDs formed on the multi-color substrate 957' may be expressed as a shape which is generally convex toward the center.

By applying different thicknesses in applying a color conversion material according to the location of micro LEDs as described above, the electric field efficiency and the light efficiency of micro LEDs distributed in the center portion of the multi-color substrate 957' may be improved, and the turn-on voltage may be lowered. Accordingly, by minimizing the deviation among each area of the multi-color substrate 957', the characteristics of micro LEDs arranged on the entire areas of the multi-color substrate 957' may be more uniform.

The example embodiments may be implemented as a computer-readable code written on a computer-readable recording medium. The computer-readable recording medium may be any type of recording device in which data is stored in a computer-readable manner.

Examples of the computer-readable recording medium include a ROM, a RAM, a CD-ROM, a magnetic tape, a floppy disc, an optical data storage, and a carrier wave (e.g., data transmission through the Internet). The computer-readable recording medium can be distributed over a plurality of computer systems connected to a network so that a computer-readable code is written thereto and executed therefrom in a decentralized manner. Functional programs, codes, and code segments needed for implementing the disclosure may be easily deduced by a person of ordinary skill in the art, to which the disclosure pertains.

At least one of the components, elements, modules or units described herein may be embodied as various numbers of hardware, software and/or firmware structures that execute respective functions described above, according to an exemplary embodiment. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in some of block diagrams, communication between the components, elements or units may be performed through the bus. Functional aspects of the above exemplary embodiments may be implemented in algorithms that execute on one or more processors. Furthermore, the components, elements or units represented by a block or processing operations may employ any number of related art techniques for electronics configuration, signal processing and/or control, data processing and the like.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A display module comprising:
    a substrate;
    a layer including thin film transistor (TFT) layer and provided on the substrate; and
    a plurality of pixels arranged at specific pitches on the layer,
    wherein each pixel includes first micro light emitting diodes (LEDs) in a first color and second micro LEDs in a second color different from the first color,
    wherein the first micro LEDs and the second micro LEDs are transferred from a transfer substrate to the layer,
    wherein the transfer substrate is provided as a multi-color substrate in which a plurality of micro LEDs in two or more colors are provided, and
    wherein the plurality of micro LEDs have different thicknesses based on an amount of a color conversion material applied to the plurality of micro LEDs.

2. The display module of claim 1,
    wherein, in each transfer operation, the first micro LEDs and the second micro LEDs are transferred to the TFT layer according to a same transfer pattern.

3. The display module of claim 1,
    wherein a transfer pattern in transferring at least one of the first micro LEDs and at least one of the second micro LEDs is based on a color pattern of the plurality of micro LEDs in the two or more colors on the multi-color substrate.

4. The display module of claim 3,
    wherein the transfer pattern comprises at least one of an L-shaped pattern, a triangle-shaped pattern, or a square-shaped pattern.

5. The display module of claim 1,
    wherein a transfer pattern in transferring at least one of the first micro LEDs and at least one of the second micro LEDs is based on a square-shaped pattern of different colors by the plurality of micro LEDs on the multi-color substrate.

6. The display module of claim 1,
    wherein a size of each of the first micro LEDs is different from a size of each of the second micro LEDs.

7. The display module of claim 6,
    wherein each pixel further includes third micro LEDs in a third color different from the first color and the second color, and a size of each of the third micro LEDs is equal to the size of each of the first micro LEDs or the size of each of the second micro LEDs.

8. The display module of claim 1,
    wherein a micro LED located toward an outer rim portion of the multi-color substrate, among the plurality of micro LEDs, has a greater thickness than a micro LED located at a center portion of the multi-color substrate.

9. The display module of claim 1,
    wherein a micro LED located toward an outer rim portion of the multi-color substrate, among the plurality of micro LEDs, has a smaller thickness than a micro LED located at a center portion of the multi-color substrate.

* * * * *